(12) United States Patent
Kim et al.

(10) Patent No.: US 12,374,669 B2
(45) Date of Patent: Jul. 29, 2025

(54) DEVICE TRANSFER SUBSTRATE RECEIVING A LIGHT EMITTING DEVICE, DEVICE TRANSFER STRUCTURE, AND DISPLAY APPARATUS

(71) Applicant: SAMSUNG ELECTRONICS CO., LTD., Suwon-si (KR)

(72) Inventors: Hyunjoon Kim, Seoul (KR); Dongkyun Kim, Suwon-si (KR); Joonyong Park, Suwon-si (KR); Seogwoo Hong, Yongin-si (KR); Kyungwook Hwang, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 411 days.

(21) Appl. No.: 17/735,747

(22) Filed: May 3, 2022

(65) Prior Publication Data
US 2023/0141485 A1 May 11, 2023

(30) Foreign Application Priority Data

Nov. 10, 2021 (KR) .................. 10-2021-0154288

(51) Int. Cl.
H01L 25/13 (2006.01)
H01L 21/673 (2006.01)
(52) U.S. Cl.
CPC ........ *H01L 25/13* (2013.01); *H01L 21/67333* (2013.01)

(58) Field of Classification Search
CPC ...... B65G 47/91; B65G 47/90; B65G 47/917; B65G 47/92; H01L 21/67333;
(Continued)

(56) References Cited

U.S. PATENT DOCUMENTS 10,361,337 B2   7/2019   Ahmed et al.
10,644,190 B2   5/2020   Zhan et al.
(Continued)

FOREIGN PATENT DOCUMENTS

EP   4 053 897 A1   9/2022
EP   4 075 499 A1   10/2022
(Continued)

OTHER PUBLICATIONS

Communication dated Nov. 17, 2022, issued by the European Patent Office in counterpart European Application No. 22176309.7.
(Continued)

Primary Examiner — Laura M Menz
Assistant Examiner — Candice Chan
(74) Attorney, Agent, or Firm — Sughrue Mion, PLLC

(57) ABSTRACT

A device transfer substrate includes a plurality of recesses, wherein each of the plurality of recesses includes a first region having a shape of a first figure, a second region having a shape of a second figure, and an overlapping region formed as a portion of the first region partially overlaps a portion of the second region, wherein a maximum width of the overlapping region in a direction intersecting with a straight line passing through a center of the first figure and a center of the second figure is less than a diameter or a diagonal length of the first figure and less than a diameter or a diagonal length of the second figure.

26 Claims, 31 Drawing Sheets

(58) Field of Classification Search
CPC . H01L 21/677; H01L 21/67703; H01L 21/68; H01L 21/683; H01L 21/687
See application file for complete search history.

(56) References Cited

U.S. PATENT DOCUMENTS

| | | |
|---|---|---|
| 11,469,132 B2 | 10/2022 | Kim et al. |
| 2004/0089932 A1 | 5/2004 | Craig et al. |
| 2018/0006011 A1 | 1/2018 | Ninan et al. |
| 2018/0076352 A1 | 3/2018 | Heine et al. |
| 2019/0326348 A1* | 10/2019 | Im .................. H01L 27/156 |
| 2020/0343230 A1 | 10/2020 | Sizov et al. |
| 2022/0285188 A1* | 9/2022 | Kim .................. H01L 33/20 |

FOREIGN PATENT DOCUMENTS

| | | |
|---|---|---|
| KR | 10-2019-0143840 A | 12/2019 |
| KR | 10-2022-0021325 A | 2/2022 |

OTHER PUBLICATIONS

Communication dated Oct. 22, 2024, issued by the European Patent Office in counterpart European Application No. 22176309.7.

\* cited by examiner

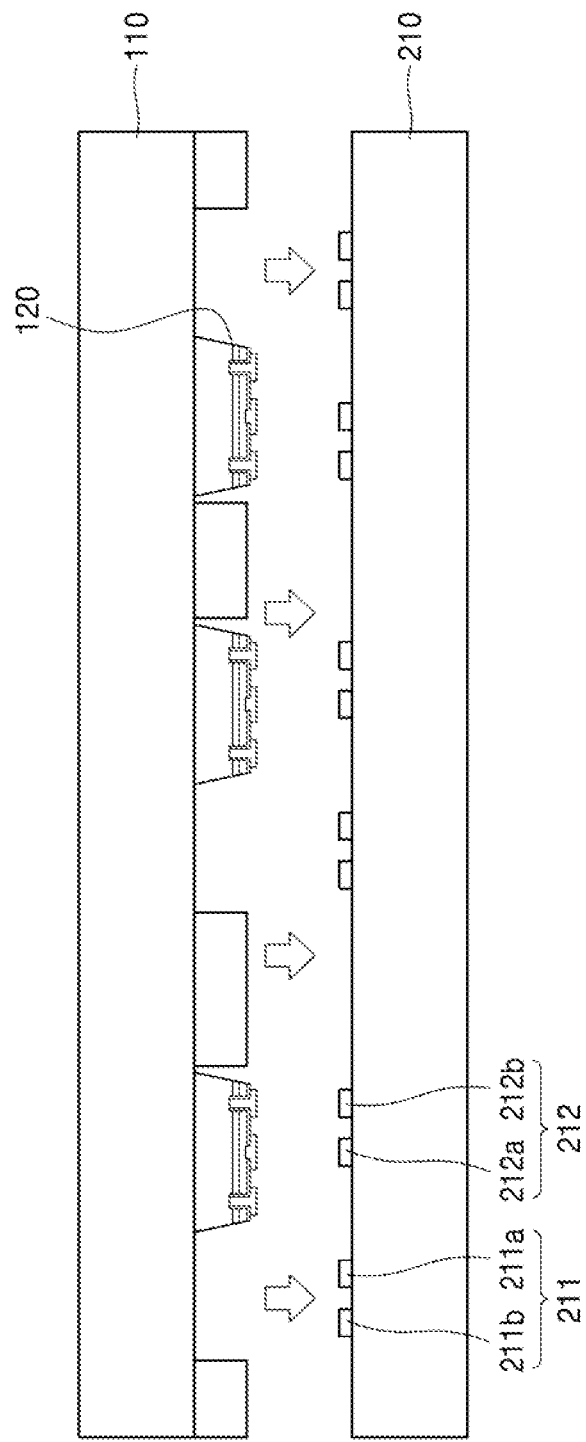

DEVICE TRANSFER SUBSTRATE RECEIVING A LIGHT EMITTING DEVICE, DEVICE TRANSFER STRUCTURE, AND DISPLAY APPARATUS

CROSS-REFERENCE TO RELATED APPLICATION

This application is based on and claims priority under 35 U.S.C. § 119 to Korean Patent Application No. 10-2021-0154288, filed on Nov. 10, 2021, in the Korean Intellectual Property Office, the disclosure of which is incorporated by reference herein in its entirety.

BACKGROUND

1. Field

The disclosure relates to a device transfer substrate for arranging devices, a device transfer structure, and a display apparatus, and more particularly, to a device transfer substrate for arranging devices capable of achieving a high transfer yield, a device transfer structure including the device transfer substrate, and a display apparatus manufactured using the device transfer substrate.

2. Description of Related Art

Light emitting diodes (LEDs), which consume low power and are eco-friendly, have increased in industrial demand and have been applied as display pixels, as well as used as pixels of display apparatuses, as well as used as backlights of lighting devices or liquid crystal displays (LCDs) Recently, micro-LED display apparatuses using a micro-LED chip as a pixel have been developed. In manufacturing display apparatuses using micro-LED chips, a pick and place method has been used as a method of transferring the micro-LEDs, but with this method, productivity decreases as the size of the micro-LEDs decreases and the size of displays increases.

SUMMARY

Provided are device transfer substrates for arranging devices to transfer a plurality of light emitting devices with high yield.

Provided are device transfer structures in which a plurality of light emitting devices are transferred and arranged using a device transfer substrate for arranging devices.

Provided are display apparatuses manufactured using a plurality of light emitting devices arranged in a device transfer structure.

Additional aspects will be set forth in part in the description which follows and, in part, will be apparent from the description, or may be learned by practice of embodiments of the disclosure.

In accordance with an aspect of the disclosure, a device transfer substrate includes a plurality of recesses, wherein each of the plurality of recesses includes a first region having a shape of a first figure; a second region having a shape of a second figure; and an overlapping region on which a portion of the first region partially overlaps a portion of the second region, and wherein a maximum width of the overlapping region in a direction intersecting with a straight line passing through a center of the first figure and a center of the second figure is less than a diameter or a diagonal length of the first figure and less than a diameter or a diagonal length of the second figure.

An area of the overlapping region may be greater than 0 and less than or equal to ½ of an area of the first figure.

A distance between the center of the first figure and the center of the second figure may be greater than or equal to ½ of the diameter or the diagonal length of the first figure, and may be less than a sum of ½ of the diameter or the diagonal length of the first figure and ½ of the diameter or the diagonal length of the second figure.

A distance between the center of the first figure and the center of the second figure may be greater than or equal to ⅔ of the diameter or the diagonal length of the first figure and may be less than a sum of ½ of the diameter or the diagonal length of the first figure and ½ of the diameter or the diagonal length of the second figure.

A difference between the diameter or the diagonal length of the first figure and the diameter or the diagonal length of the second figure may be less than or equal to about 20% of the diameter or the diagonal length of the first figure.

The first figure and the second figure may have a circular or polygonal shape.

Both the first figure and the second figure may have a quadrangular shape, and the first region and the second region may be disposed such that a periphery of a vertex of the first figure overlaps a periphery of a vertex of the second figure or such that the periphery of the vertex of the first figure overlaps a periphery of one side of the second figure.

Both the first figure and the second figure may have a trapezoidal shape, and the first region and the second region may be disposed such that a periphery of a vertex of a shorter side of the first figure overlaps a periphery of a vertex of a shorter side of the second figure or such that a periphery of a vertex of a longer side of the first figure overlaps a periphery of a vertex of a longer side of the second figure.

Each of the plurality of recesses may further include a third region having a shape of a third figure, and the third region may be disposed to partially overlap the second region and is further disposed not to overlap the first region.

The device transfer substrate may further include a barrier surrounding a boundary of each of the plurality of recesses.

The first region, the second region, and the overlapping region of one recess may be surrounded by the barrier so that the first region and the second region are connected to each other based on the overlapping region in the one recess.

In accordance with an aspect of the disclosure, a device transfer structure includes a device transfer substrate comprising a plurality of recesses; and a light emitting device disposed in each of the plurality of recesses, wherein each of the plurality of recesses includes a first region having a shape of a first figure; a second region having a shape of a second figure; and an overlapping region on which a portion of the first region partially overlaps a portion of the second region, wherein the light emitting device disposed in each of the plurality of recesses is disposed in any one of the first region and the second region, and wherein a maximum width of the overlapping region in a direction intersecting with a straight line passing through a center of the first figure and a center of the second figure is less than a diameter or a diagonal length of the first figure and less than a diameter or a diagonal length of the second figure so that the light emitting device disposed in each of the plurality of recesses does not pass through the overlapping region.

An area of the overlapping region may be greater than 0 and less than or equal to ½ of an area of the first figure.

A distance between the center of the first figure and the center of the second figure may be greater than or equal to ½ of the diameter or the diagonal length of the first figure, and may be less than a sum of ½ of the diameter or the diagonal length of the first figure and ½ of the diameter or the diagonal length of the second figure.

A distance between the center of the first figure and the center of the second figure may be greater than or equal to ⅔ of the diameter or the diagonal length of the first figure and may be less than a sum of ½ of the diameter or the diagonal length of the first figure and ½ of the diameter or the diagonal length of the second figure.

A difference between the diameter or the diagonal length of the first figure and the diameter or the diagonal length of the second figure may be less than or equal to about 20% of the diameter or the diagonal length of the first figure.

The diameter or the diagonal length of the first figure may be greater than a diameter or a diagonal length of the light emitting device, and a difference between the diameter or the diagonal length of the first figure and the diameter or the diagonal length of the light emitting device may be less than or equal to 20% of the diameter or the diagonal length of the light emitting device.

A difference between the diameter or the diagonal length of the first figure and a diameter or a diagonal length of the light emitting device may be less than or equal to 5 μm.

An area of the overlapping region may be less than an area of the light emitting device.

A size of the light emitting device may be in a range of 5 μm to 100 μm.

Each of the plurality of recesses of the device transfer substrate may further include a third region having a shape of a third figure, wherein the third region is disposed to partially overlap the second region and not to overlap the first region, and wherein the light emitting device is disposed only within the second region or within at least one of the first region and the third region.

Each of the plurality of recesses may further include a first electrode pair including a first driving electrode and a second driving electrode disposed in the first region; and a second electrode pair including a third driving electrode and a fourth driving electrode disposed in the second region, and the light emitting device may be electrically connected to any one of the first electrode pair and the second electrode pair.

The device transfer substrate may further include a barrier surrounding a boundary of each of the plurality of recesses.

The first region, the second region, and the overlapping region of one recess may be surrounded by the barrier so that the first region and the second region are connected based on the overlapping region in the one recess.

In accordance with an aspect of the disclosure, a display apparatus includes a display substrate including a plurality of sub-pixels arranged two dimensionally and a driving circuit; and a plurality of light emitting devices disposed on the display substrate, wherein each of the plurality of sub-pixels includes a first region and a second region partially overlapping each other on the display substrate, and wherein the plurality of light emitting devices are irregularly disposed in any one of the first region and the second region of the plurality of sub-pixels.

The display apparatus may further include a first electrode pair including a first driving electrode and a second driving electrode disposed in the first region; and a second electrode pair including a third driving electrode and a fourth driving electrode disposed in the second region, wherein, when the light emitting device is disposed in the first region, the light emitting device is electrically connected to the first electrode pair and not electrically connected to the second electrode pair, and wherein, when the light emitting device is disposed in the second region, the light emitting device is electrically connected to the second electrode pair and not electrically connected to the first electrode pair.

The display apparatus may further include a wavelength conversion layer configured to convert a wavelength of light emitted from the plurality of light emitting devices.

The wavelength conversion layer may include a first wavelength conversion layer configured to convert the light emitted from the plurality of light emitting devices into light having a first wavelength band; and a second wavelength conversion layer configured to convert the light emitted from the plurality of light emitting devices into light having a second wavelength band that is different from the first wavelength band.

The display apparatus may further include a color filter layer include a first filter disposed to face the first wavelength conversion layer and configured to transmit light having the first wavelength band; and a second color filter layer disposed to face the second wavelength conversion layer and configured to transmit light having the second wavelength band.

In accordance with an aspect of the disclosure, a device transfer substrate may include a plurality of recesses, each of the plurality of recesses including a first end having a first width, a second end having a second width, and a middle portion between the first end and the second end, the middle portion having a middle width, wherein the middle width is less than the first width and the middle width is less than the second width.

The first end may have a shape of a first figure and the second end may have a shape of a second figure, and the first figure and the second figure may partially overlap to form the middle portion.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 15 is a cross-sectional view schematically illustrating a process of transferring a light emitting device arranged on a device transfer substrate onto a display substrate of a display apparatus;

DETAILED DESCRIPTION

Figure 1:
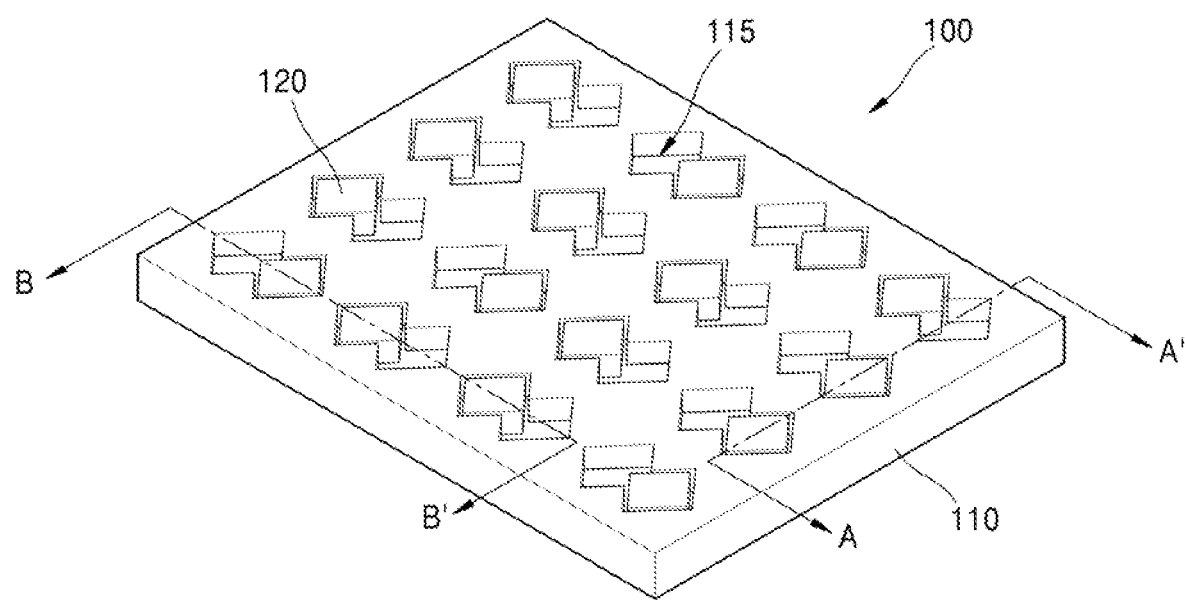
FIG. 1 is a perspective view schematically illustrating a device transfer structure according to an embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, a device transfer substrate for arranging devices, a device transfer structure, and a display apparatus will be described in detail with reference to the accompanying drawings. In the following drawings, like reference numerals refer to like components, and the size of each component in the drawings may be exaggerated for clarity and convenience of description. Embodiments described herein are merely examples, and various modifications may be made from these embodiments.

When it is described that a certain component is "above" or "on" another component, the certain component may be directly above another component, or a third component may be interposed therebetween. The singular expressions include plural expressions unless the context dearly dictates otherwise. When a part "includes" a component, it may indicate that the part does not exclude another component but may further include another component, unless otherwise stated.

The use of the terms "a" and "an" and "the" and similar referents may cover both the singular and the plural. The steps constituting a method may be performed in any suitable order unless there is a clear statement that the steps in the method should be performed in the order described, without being limited to the described order.

In addition, terms such as "unit" or "module," disclosed in the specification indicate a unit for processing at least one function or operation, and this may be implemented by hardware, software, or a combination thereof.

The connecting lines, or connectors illustrated in the various figures presented are intended to represent example functional relationships and/or physical or logical couplings between the various elements. It should be noted that many alternative or additional functional relationships, physical connections or logical connections may be present in a practical device.

In addition, the use of all examples and example terms is merely for describing technical ideas in detail, and the scope of the disclosure is not limited by these terms unless limited by claims.

FIG. 1 is a perspective view schematically illustrating a device transfer structure 100 according to an example embodiment. Referring to FIG. 1, the device transfer structure 100 may include a device transfer substrate 110 for arranging devices, the device arrangement having a plurality of recesses 115, and light emitting devices 120 respectively disposed in the recesses 115.

Figure 2:
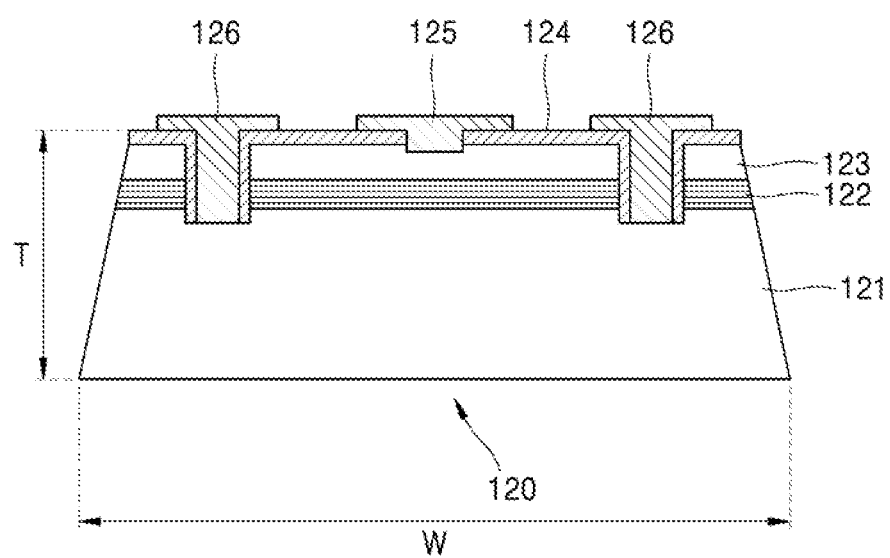
FIG. 2 is a cross-sectional view schematically illustrating a structure of a light emitting device.

FIG. 2 is a cross-sectional view schematically illustrating a structure of the light emitting device 120. Referring to FIG. 2, the light emitting device 120 may include a first semiconductor layer 121, a light emitting layer 122 disposed on an upper surface of the first semiconductor layer 121, a second semiconductor layer 123 disposed on an upper surface of the light emitting layer 122, an insulating layer 124 disposed on an upper surface of the second semiconductor layer 123, a first device electrode 125 disposed on an upper surface of the insulating layer 124 and electrically connected to the second semiconductor layer 123, and a second device electrode 126 disposed on an upper surface of the insulating layer 124 and electrically connected to the first semiconductor layer 121.

The first semiconductor layer 121 and the second semiconductor layer 123 may include, for example, a group III-V or group II-VI compound semiconductor. The first semiconductor layer 121 and the second semiconductor layer 123 may provide electrons and holes to the light emitting layer 122. To this end, the first semiconductor layer 121 and the second semiconductor layer 123 may be electrically doped in opposite types. For example, the first semiconductor layer 121 may be doped n-type and the second semiconductor layer 123 may be doped p-type, or the first semiconductor layer 121 may be doped p-type and the second semiconductor layer 123 may be doped n-type.

The light emitting layer 122 has a quantum well structure in which quantum wells are disposed between barriers. As electrons and holes provided from the first semiconductor layer 121 and the second semiconductor layer 123 are recombined in the quantum well in the light emitting layer 122, light may be generated. A wavelength of light generated by the light emitting layer 122 may be determined according to an energy band gap of a material forming the quantum well in the light emitting layer 122. The light emitting layer 122 may have only one quantum well or may have a multi-quantum well (MQW) structure in which a plurality of quantum wells and a plurality of barriers are alternately disposed. A thickness of the light emitting layer 122 or the number of quantum wells in the light emitting layer 122 may be appropriately selected considering a driving voltage and luminous efficiency of the light emitting device.

In order to easily arrange the light emitting device 120 in a fluidic self-assembly or dry self-assembly method to be described later, both the first device electrode 125 and the second device electrode 126 may be disposed on one surface (e.g., on the same surface) of the light emitting device 120. For example, the insulating layer 124 may be formed on the upper surface of the second semiconductor layer 123, and the first device electrode 125 and the second device electrode 126 may be disposed on the upper surface of the insulating layer 124. In order to electrically connect the second device electrode 126 to the first semiconductor layer 121, the light emitting device 120 may further include a via hole passing through the second semiconductor layer 123 and the light emitting layer 122. The insulating layer 124 may extend to surround a sidewall of the via hole. In other words, a portion of the second semiconductor layer 123 and a portion of the light emitting layer 122, exposed by the via hole, may be covered with the insulating layer 124. The second device electrode 126 may extend from the upper surface of the insulating layer 124 to the upper surface of the first semiconductor layer 121 exposed through the via hole to contact the first semiconductor layer 121 through the via hole. The first device electrode 125 may be configured to pass through the insulating layer 124 and contact the second semiconductor layer 123. Also, a portion of the first device electrode 125 may further extend in a lateral direction from the upper surface of the insulating layer 124.

The light emitting device 120 may have a small size on a micro-scale. For example, the size of the light emitting device 120 may be in the range of 5 μm to 100 μm. Alternatively, the size of the light emitting device 120 may be in the range of 20 μm to 50 μm or in the range of 5 μm to 20 μm. Here, the size may be defined as a diameter of the light emitting device 120, a width W of a longer side, or a square root of an area. In addition, the diameter or the width W of the longer side of the light emitting device 120 may be greater than a thickness T of the light emitting device 120. For example, a ratio of the diameter or the width W of the longer side of the light emitting device 120 to the thickness T of the light emitting device 120 may be 1 or greater, or 5 or greater.

Referring back to FIG. 1, the device transfer substrate 110 is to arrange the light emitting devices 120 by a fluidic or dry self-assembly method, and the recesses 115, in which the light emitting devices are disposed, may be provided on the upper surface of the device transfer substrate 110. As illustrated in FIG. 1, the recesses 115 may be arranged in a two-dimensional array form in the upper surface of the device transfer substrate 110, and the light emitting devices may be arranged in the recesses 115, respectively.

Figure 3:
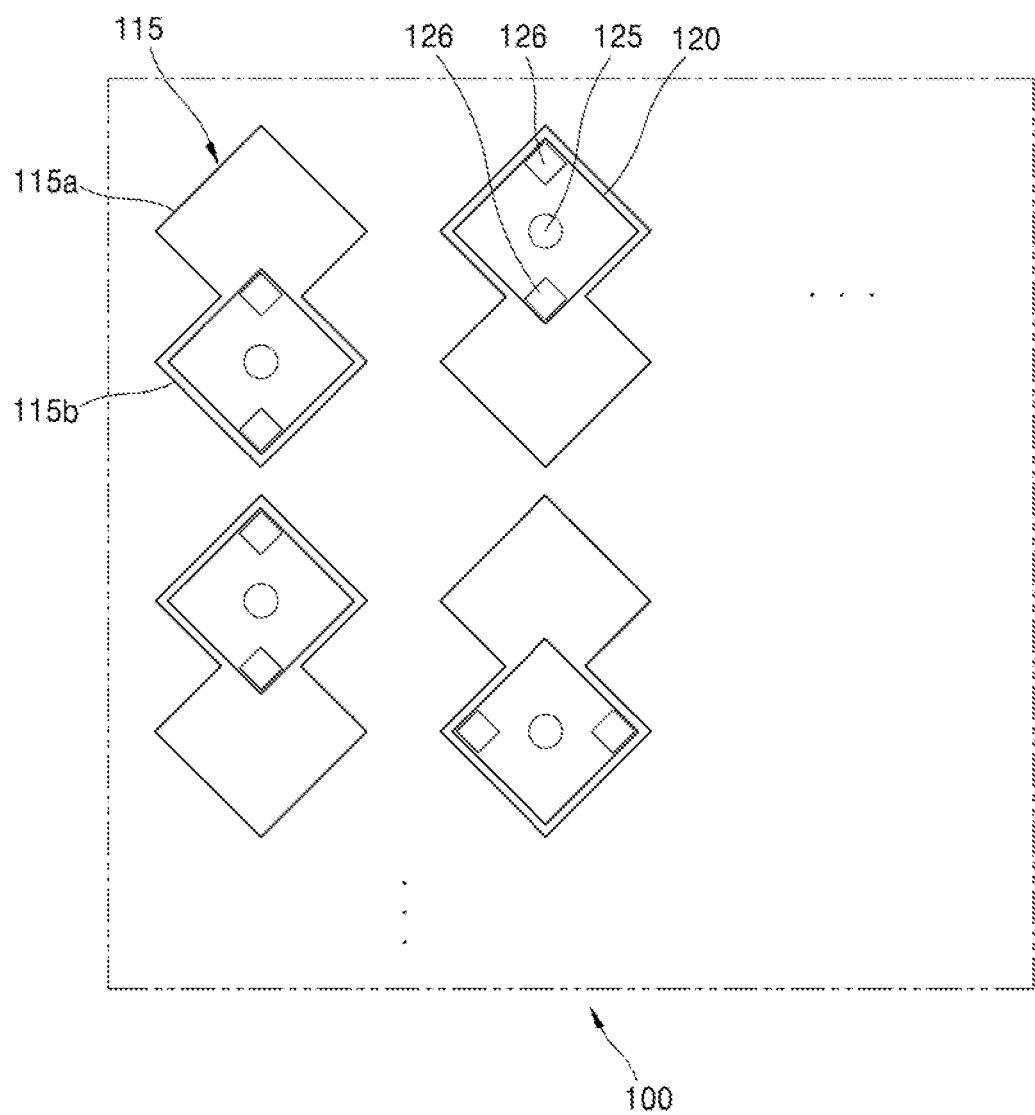
FIG. 3 is an enlarged schematic plan view of a partial region of the device transfer structure illustrated in FIG. 1.

FIG. 3 is an enlarged schematic plan view of a partial region of the device transfer structure 100 illustrated in FIG. 1. Referring to FIG. 3, each of the recesses 115 may include a first region 115a (e.g., a first end) and a second region 115b (e.g., a second end) in which the light emitting device 120 may be disposed. The light emitting device 120 may be positioned in only one of the first region 115a and the second region 115b of each recess 115. In other words, a total of two light emitting devices 120 may not be received in any one of the recesses 115. To this end, the first region 115a and the second region 115b may partially overlap each other.

In order for the first device electrode 125 and the second device electrode 126 of the light emitting device 120 to be easily bonded to the corresponding electrodes on a display substrate in the manufacturing process of the display apparatus, the first device electrode 125 and the second device electrode 126 may have a symmetrical shape. The first device electrode 125 may be disposed at the center of the light emitting device 120. The first device electrode 125 may have a circular shape. However, the disclosure is not limited thereto, and the first device electrode 125 may have a quadrangle or other polygonal shape. The second device electrode 126 may be disposed at an edge of the light emitting device 120. The second device electrode 126 may have a symmetrical shape with respect to the first device electrode 125. For example, the second device electrode 126 may be disposed at two vertex regions facing each other in a diagonal direction.

Figure 4:
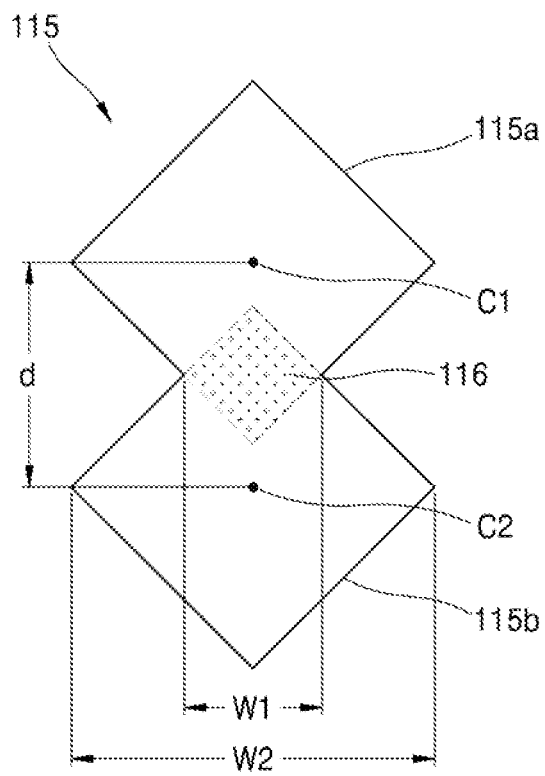
FIG. 4 is a plan view illustrating in detail a shape of a recess provided in a device transfer substrate of the device transfer structure illustrated in FIG. 1.

FIG. 4 is a plan view illustrating in detail a shape of the recess 115 provided in the device transfer substrate 110 of the device transfer structure 100 illustrated in FIG. 1. Referring to FIG. 4, each of the recesses 115 has a first region 115a having a shape of a first figure, a second region 115b having a shape of a second figure, and an overlapping region 116 (e.g., a middle portion) formed as a portion of the first region 115a spatially overlaps a portion of the second region 115b. In one recess 115, the first region 115a and the second region 115b may be connected to each other based on the overlapping region 116. Accordingly, the first region 115a, the second region 115b, and the overlapping region 116 are divided for convenience of description, and may actually form an internal space of one recess 115 together.

The first figure and the second figure may have the same size and shape, but are not limited thereto. Although the first figure and the second figure are illustrated as square in FIG. 4, the disclosure is not limited thereto. The first figure and the second figure may have a shape similar to a horizontal cross-sectional shape of the light emitting device 120, but are not limited thereto. The first figure and the second figure may have a shape and size in which the light emitting device 120 may be stably positioned in the first region 115a or the second region 115b. For example, the first figure and the second figure may have a circle shape or various polygonal shapes such as a rectangle, a square, a trapezoid, and a hexagon. In addition, the horizontal cross-section of the light emitting device 120 may also have a circle shape or various polygonal shapes, such as a rectangle, a square, a trapezoid, and a hexagon.

According to an embodiment, an area of each of the first figure and the second figure may be greater than an area of the cross-section of the light emitting device 120 so that the light emitting device 120 may be received in the first region 115a or the second region 115b. For example, a diameter or a diagonal length of each of the first figure and the second figure may be greater than a diameter or diagonal length of the light emitting device 120, and in particular, a difference between the diameter or diagonal length of each of the first figure and the second figure and the diameter or diagonal length of the light emitting device 120 may be less than or equal to about 20% of the diameter or diagonal length of the light emitting device 120. Alternatively, a difference between the diameter or diagonal length of each of the first figure and the second figure and the diameter or diagonal length of the light emitting device 120 may be greater than 0 μm and less than or equal to about 5 μm. Also, the sizes of the first figure and the second figure may be the same or different within a certain range. For example, a difference between the diameter or diagonal length of the first figure and the diameter or diagonal length of the second figure may be less than or equal to about 20% of the diameter or diagonal length of the first figure.

When the light emitting device 120 first enters the first region 115a, an additional light emitting device 120 cannot enter the second region 115b, and vice versa. To this end, a portion of the first region 115a and a portion of the second region 115b may spatially overlap each other. In addition, when both the first region 115a and the second region 115b are empty, the light emitting device 120 may enter only any one of the first region 115a and the second region 115b and cannot enter only the overlapping region. To this end, an area of the overlapping region 116 may be greater than 0 and less than the area of the light emitting device 120.

In addition, a maximum width W1 of the overlapping region 116 (e.g., a middle width) in a direction intersecting with a straight line passing through a center C1 of the first figure and a center C2 of the second figure may be greater than 0 and may be less than a maximum width, a diameter, or a diagonal length W2 of the first region 115a (e.g., a first width) and the second region 115b (e.g., a second width). Accordingly, each of the recesses 115 may have a concave shape in a middle portion thereof. Accordingly, once the light emitting device 120 is positioned in the first region 115a or the second region 115b, the light emitting device 120 cannot move to another region through the overlapping region 116 in the recess 115. For example, when the light emitting device 120 is first positioned in the first region 115a, the light emitting device 120 cannot then move to the second region 115b through the overlapping region 116 in the recess 115, and when the light emitting device 120 is first positioned in the second region 115b, the light emitting device 120 cannot then move to the first region 115a through the overlapping region 116 in the recess 115.

In addition, if the degree of spatial overlap between the first region 115a and the second region 115b is too large, that is, if the center C1 of the first figure and the center C2 of the second figure are too close, it may be difficult to install driving electrodes of the display substrate to be described below not to overlap each other. Therefore, the distance d between the center C1 of the first figure and the center C2 of the second figure may be sufficiently large. For example, the distance d between the center C1 of the first figure and the center C2 of the second figure may be greater than or equal to ½ of the diameter or diagonal length W2 of the first figure, and may be less than the sum of ½ of the diameter or diagonal length of the first figure and ½ of the diameter or diagonal length of the second figure. Alternatively, the distance between the center C1 of the first figure and the center C2 of the second figure may be greater than or equal to ⅔ of the diameter or diagonal length of the first figure and may be less than the sum of ½ of the diameter or diagonal length of the first figure and ½ of the diameter or diagonal length of the second figure. Also, the area of the overlapping region 116 may be greater than 0 and less than or equal to ½ of the area of the first figure or less than or equal to ½ of the area of the second figure.

Figure 5:
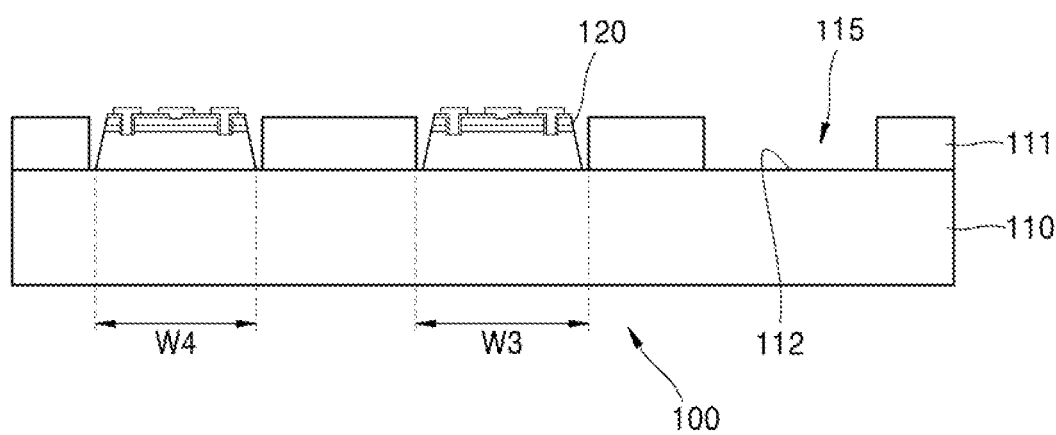
FIGS. 5 and 6 are partial cross-sectional views schematically illustrating the device transfer structure illustrated in FIG. 1.
Figure 6:
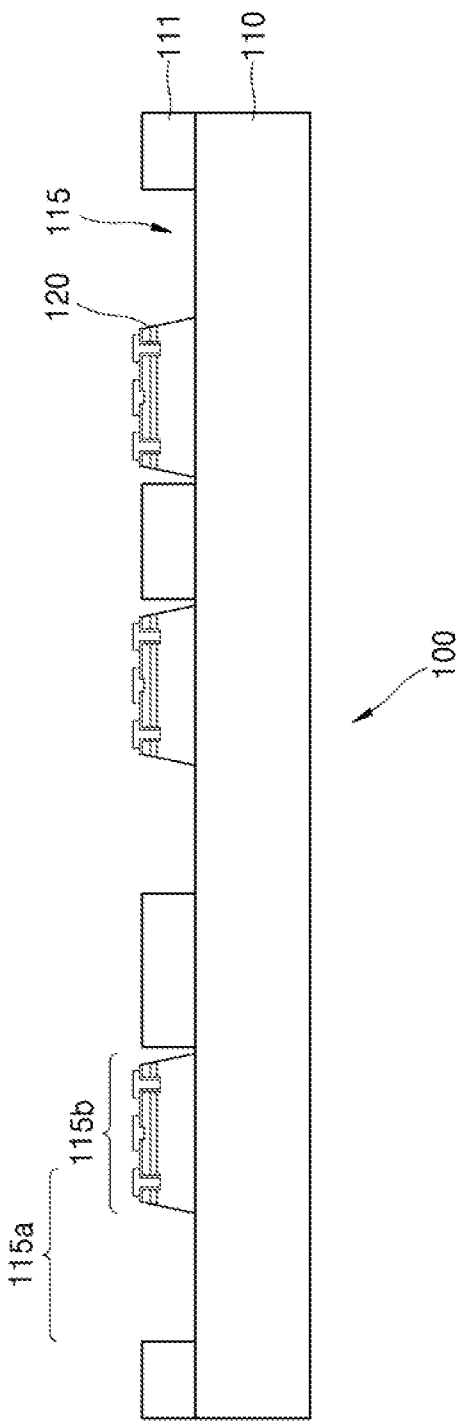

FIGS. 5 and 6 are partial cross-sectional views schematically illustrating the device transfer structure 100 illustrated in FIG. 1. In particular, FIG. 5 is a cross-sectional view taken along line A-A' of FIG. 1, and FIG. 6 is a cross-sectional view taken along line B-B' of FIG. 1. Referring to FIGS. 5 and 6, the device transfer substrate 110 may include a barrier 111 surrounding a boundary of each recess 115. The first region 115a, the second region 115b, and the overlapping region 116 of one recess 115 may be surrounded by the barrier 111 so that the first region 115a, the second region 115b, and the overlapping region 116 of one recess 115 may be connected to each other based on the overlapping region 116 within the barrier 111. A bottom surface 112 of each of the recesses 115 may extend along the first region 115a, the second region 115b, and the overlapping region 116, and may have a smooth surface with little or no curvature.

In addition, referring to FIG. 5, a maximum width, a diameter, or a diagonal length W3 of the first region 115a and the second region 115b in a direction intersecting with a straight line passing through the center C1 of the first figure and the center C2 of the second figure may be slightly greater than a width W4 of the light emitting device 120. For example, the maximum width, diameter, or diagonal length W3 of the first region 115a and the second region 115b in the direction intersecting with the straight line passing through the center C1 of the first figure and the center C2 of the second figure may be greater by about 20% than the width W4 of the light emitting device 120. Alternatively, a difference between the maximum width, diameter, or diagonal length W3 of each of the first region 115a and the second region 115b in the direction intersecting with the straight line passing through the center C1 of the first figure and the center C2 of the second figure and the diameter of the diagonal length W4 of the light emitting device 120 may be greater than 0 μm and less than or equal to about 5 μm. Accordingly, the light emitting device 120 received in the recess 115 may move only within a limited range within the recess 115, in particular, within the first region 115a or the second region 115b.

Referring to FIG. 6, the light emitting device 120 may be disposed in only any one of the first region 115a and the second region 115b, and the other one of the first region 115a or the second region 115b, in which the light emitting device 120 is not disposed, may be empty. As illustrated in FIG. 4, because the width of the overlapping region 116 at the center in a direction passing through the center C1 of the first figure and the center C2 of the second figure is narrower than the width of the first region 115a and the second region 115b, once the light emitting device 120 enters one of the first region 115a and the second region 115b, the light emitting device 120 cannot then move to the other one of the second region 115b and the first region 115a and may move only within a limited range within the first region 115a or the second region 115b.

Figure 7:
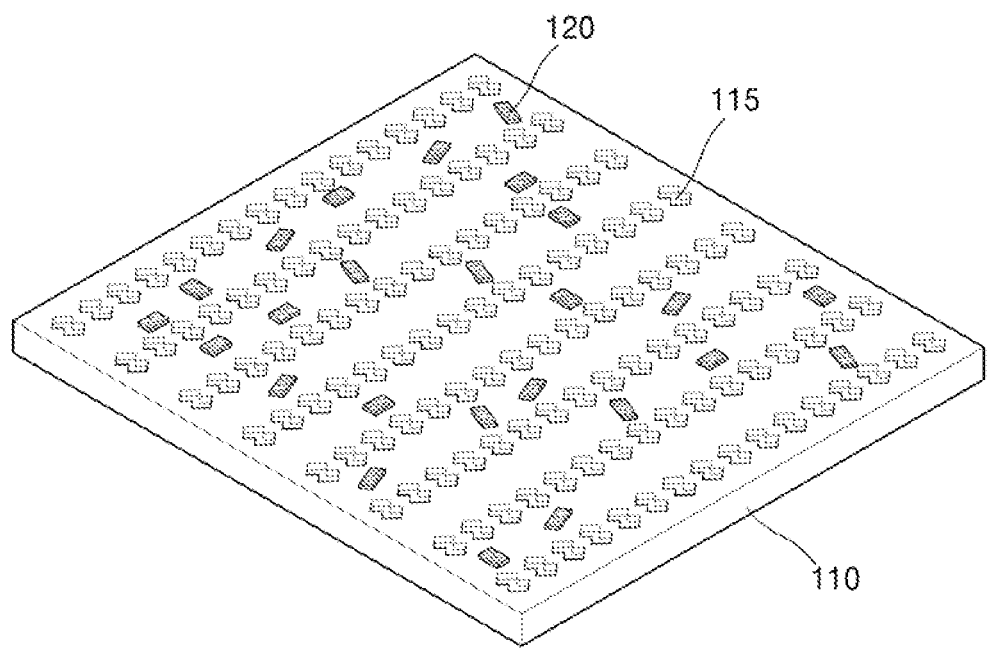
FIG. 7 is a perspective view illustrating a method of arranging a light emitting device using a fluidic self-assembly method.

In the recess 115 of the device transfer substrate, for example, the light emitting device 120 may be arranged by a fluidic self-assembly method or a dry self-assembly method. FIG. 7 is a perspective view illustrating a method of arranging the light emitting device 120 using a fluidic self-assembly method. Referring to FIG. 7, the light emitting devices 120 may be provided on the upper surface of the device transfer substrate 110 having the recesses 115, which are two-dimensionally arranged. The light emitting devices 120 may be directly scattered onto the device transfer substrate 110 after a liquid is supplied to the recesses 115 of the device transfer substrate 110 or may be included in a suspension and supplied onto the device transfer substrate 110.

Figure 8:
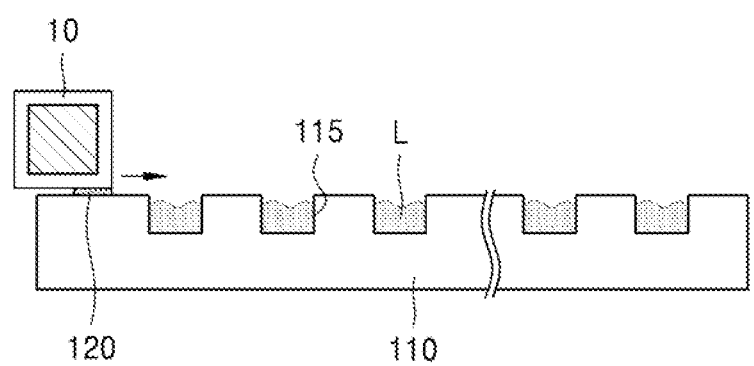
FIG. 8 schematically shows a scanning process of arranging a light emitting device through physical contact by a rod or a blade.

The light emitting devices 120 supplied on the device transfer substrate 110 pass by or over the recess 115 in the device transfer substrate 110 by external stimulus such as any one or more of ultrasonic waves, vibrations, magnetic fields, fluid flow, and physical contact according to a transfer method. For example, FIG. 8 schematically shows a scanning process for arranging the light emitting device 120 through physical contact by a rod or a blade 10. While the light emitting devices 120 pass by or over the recess 115, the light emitting devices 120 are caught by a capillary force by a liquid L in the recess 115 and positioned in the recess 115 as the liquid L is evaporated, or blocked by the edge of the recess 115 to settle inside the recess 115.

As described above, one recess 115 of the device transfer substrate according to the embodiment has two regions for accommodating the light emitting device 120, that is, the first region 115a and the second region 115b. The light emitting device 120 may settle in the first region 115a or the second region 115b with a high probability according to the fluidic self-assembly method or the dry self-assembly method. Therefore, compared to a case in which one recess includes one accommodation region having a size similar to that of the light emitting device 120, transfer yield when arranging the light emitting device 120 on the device transfer substrate 110 may be improved. In addition, because only one light emitting device 120 enters one recess 115, the amount of use of the light emitting device 120 may be reduced to almost half, compared to a case in which two light emitting devices are redundantly disposed in one cell of a display apparatus.

Figure 9A:
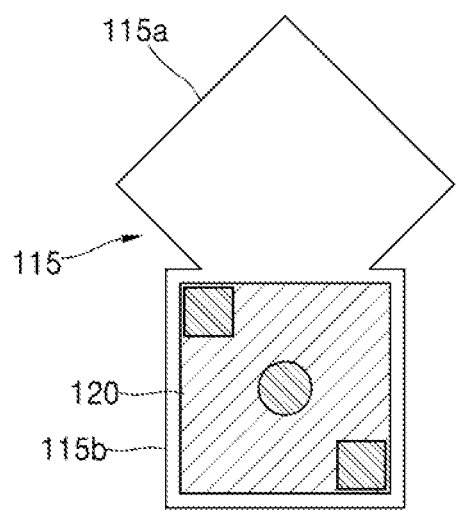
FIGS. 9A and 9B are plan views illustrating a shape of a recess of a device transfer substrate according to an embodiment.
Figure 9B:
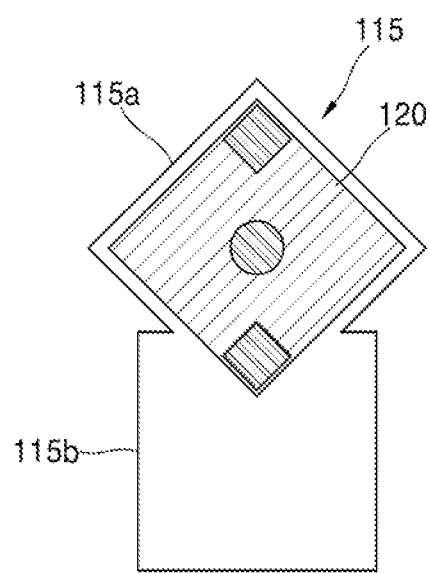

FIGS. 9A and 9B are plan views illustrating a shape of the recess 115 of the device transfer substrate according to an embodiment. In the example of the recess 115 illustrated in FIG. 4, both the first figure of the first region 115a and the second figure of the second region 115b are square, and the first region 115a and the second region 115b are disposed such that the periphery of one vertex of the first figure and the periphery of one vertex of the second figure overlap each other. However, the recess 115 may have various other shapes and arrangements. For example, referring to FIGS. 9A and 9B, both the first figure of the first region 115a and the second figure of the second region 115b may be square and the first region 115a and the second region 115b may be disposed such that the periphery of one vertex of the first figure and the periphery of one side of the second figure overlap each other. In other words, the first region 115a and the second region 115b may be disposed such that one of the first figure and the second figure is in a state of being rotated relative to the other.

Figure 10A:
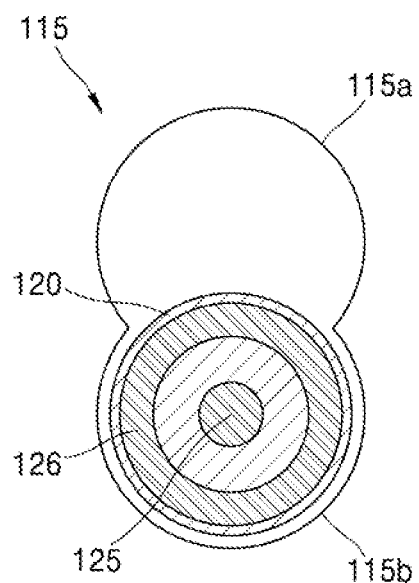
FIGS. 10A and 10B are plan views illustrating a shape of a recess of a device transfer substrate according to an embodiment.
Figure 10B:
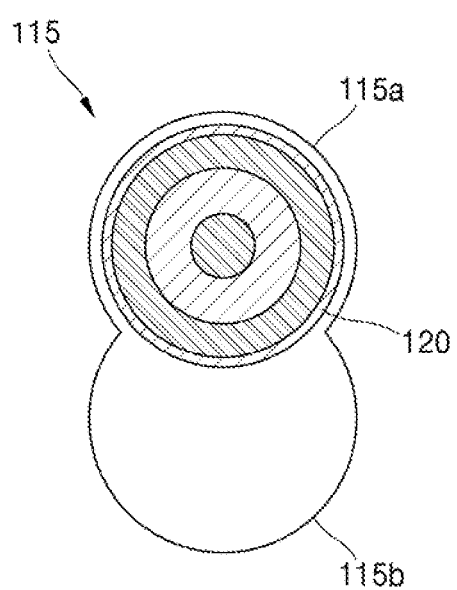

FIGS. 10A and 10B are plan views illustrating a shape of the recess 115 of the device transfer substrate according to an embodiment. Referring to FIGS. 10A and 10B, both the first figure of the first region 115a and the second figure of the second region 115b may be circular. In this case, the cross-section of the light emitting device 120 may also be circular. The second device electrode 126 of the light emitting device 120 may be arranged in a ring shape along the edge of the upper surface of the light emitting device 120.

FIGS. 11A to 11D are plan views illustrating a shape of the recess 115 of the device transfer substrate 110 according to an embodiment. Referring to FIGS. 11A to 11D, both the first figure of the first region 115a and the second figure of the second region 115b may have a trapezoidal shape. In this case, the cross-section of the light emitting device 120 may also have a trapezoidal shape. The second device electrode 126 of the light emitting device 120 may be disposed at one vertex region of a longer side of the trapezoidal shape, and the first device electrode 125 may be disposed at one vertex region of a shorter side of the trapezoidal shape. Also, the first device electrode 125 and the second device electrode 126 may be disposed in a trapezoidal diagonal direction. Accordingly, when the light emitting device 120 has a trapezoidal shape, the first device electrode 125 and the second device electrode 126 may not be symmetrically disposed.

Figure 11A:
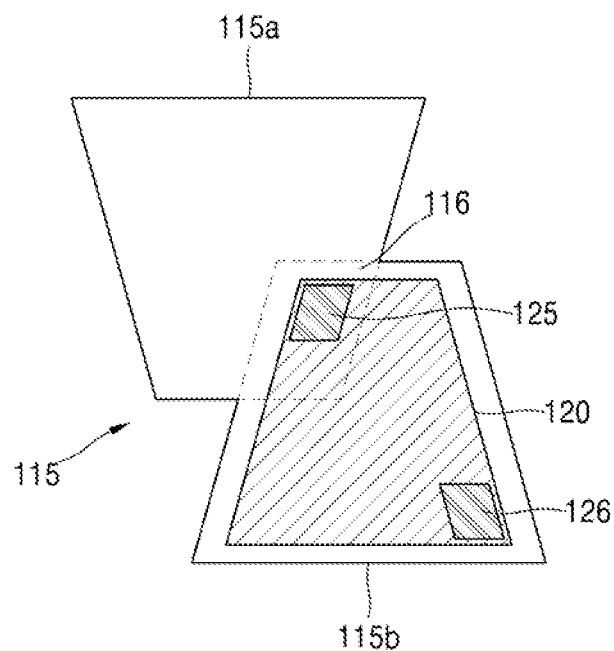
FIGS. 11A to 11D are plan views illustrating a shape of a recess of a device transfer substrate according to an embodiment.
Figure 11B:
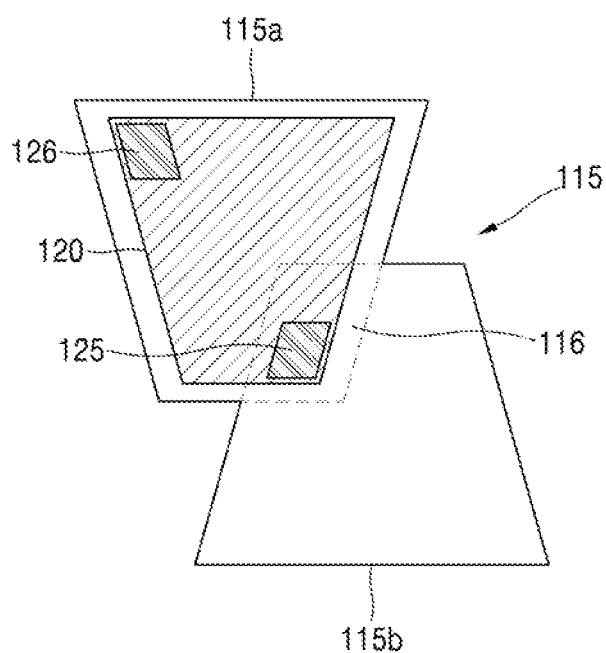

As shown in FIGS. 11A and 11B, the first region 115a and the second region 115b may be arranged such that the periphery of one vertex of the shorter side of the first figure and the periphery of one vertex of the shorter side of the second figure overlap each other. In particular, the first region 115a and the second region 115b may be disposed such that the periphery of the vertex, among the two vertices of the shorter side, corresponding to the position of the vertex of the first device electrode 125 of the light emitting device 120 overlap each other. Then, no matter which of the first region 115a and the second region 115b the light emitting device 120 is disposed in, the first device electrode 125 of the light emitting device 120 may always be positioned in the overlapping region 116 of the first region 115a and the second region 115b.

Figure 11C:
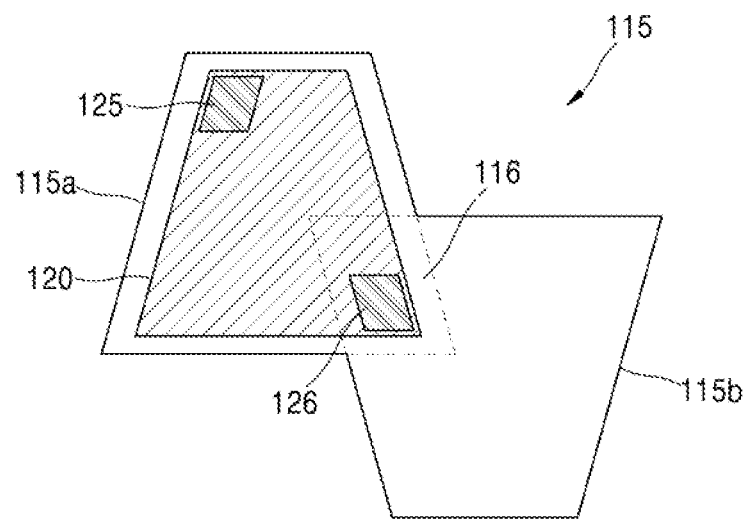
Figure 11D:
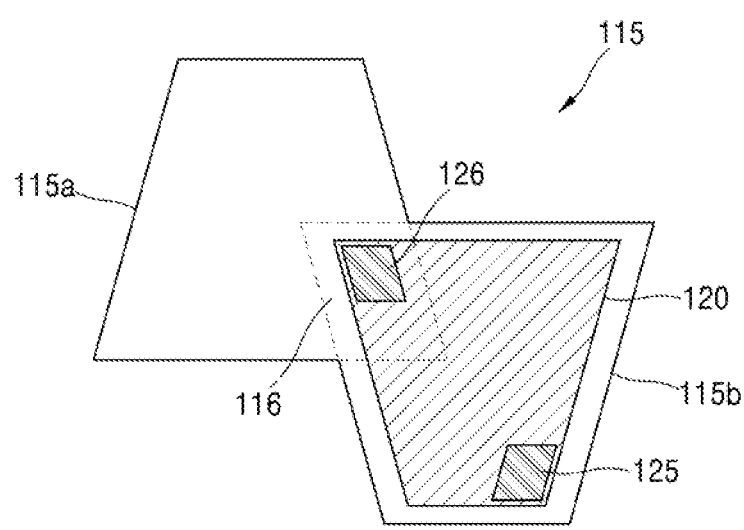

Alternatively, as illustrated in FIGS. 11C and 11D, the first region 115a and the second region 115b may be disposed such that the periphery of one vertex of the longer side of the first figure and the periphery of one vertex of the longer side of the second figure overlap each other. In particular, the first region 115a and the second region 115b may be disposed such that the periphery of the vertex, among the two vertices of the longer side, corresponding to the position of the vertex of the second device electrode 126 of the light emitting device 120 overlap each other. Then, no matter which of the first region 115a and the second region 115b the light emitting device 120 is disposed in, the second device electrode 126 of the light emitting device 120 may always be positioned in the overlapping region 116 of the first region 115a and the second region 115b.

FIGS. 12A to 12D are plan views illustrating a shape of the recess 115 of the device transfer substrate 110 according to an embodiment. So far, it has been described that one recess 115 has two regions which overlap each other, but the disclosure is not limited thereto and one recess 115 may have three or more regions which overlap each other. Referring to FIGS. 12A to 12D, one recess 115 may include a first region 115a having a shape of a first figure, a second region 115b having a shape of a second figure, and a third region 115c having a shape of a third figure. For example, the first to third figures may each have a square shape, and the light emitting device 120 may also have a square shape. The first region 115a and the second region 115b may spatially partially overlap each other, and the second region 115b and the third region 115c may spatially partially overlap each other. However, the first region 115a and the third region 115c may not overlap each other.

Figure 12A:
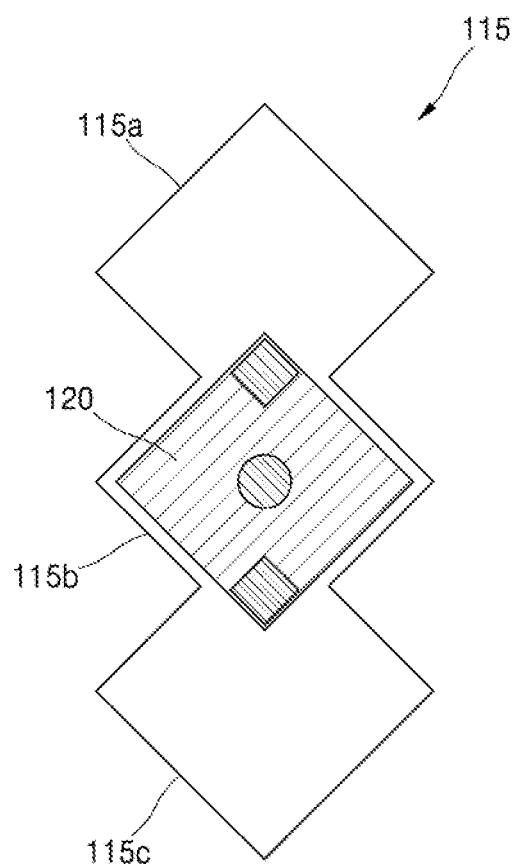
FIGS. 12A to 12D are plan views illustrating a shape of a recess of a device transfer substrate according to an embodiment.
Figure 12B:
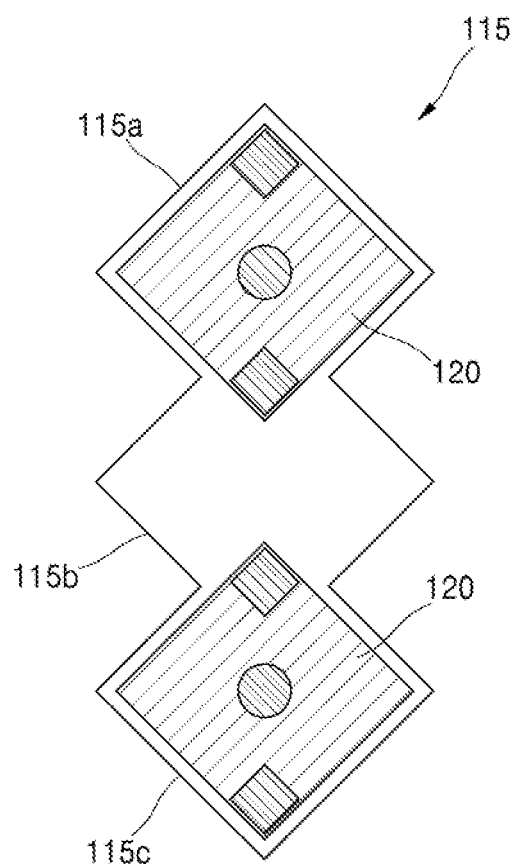
Figure 12C:
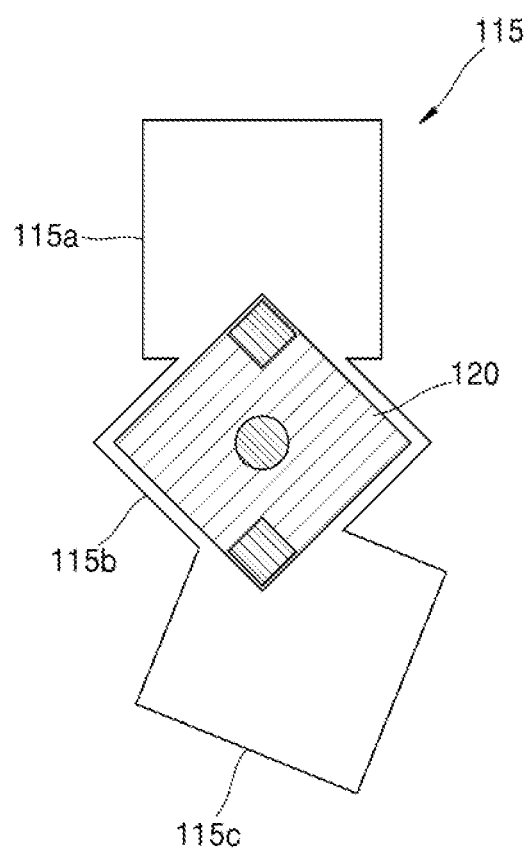
Figure 12D:
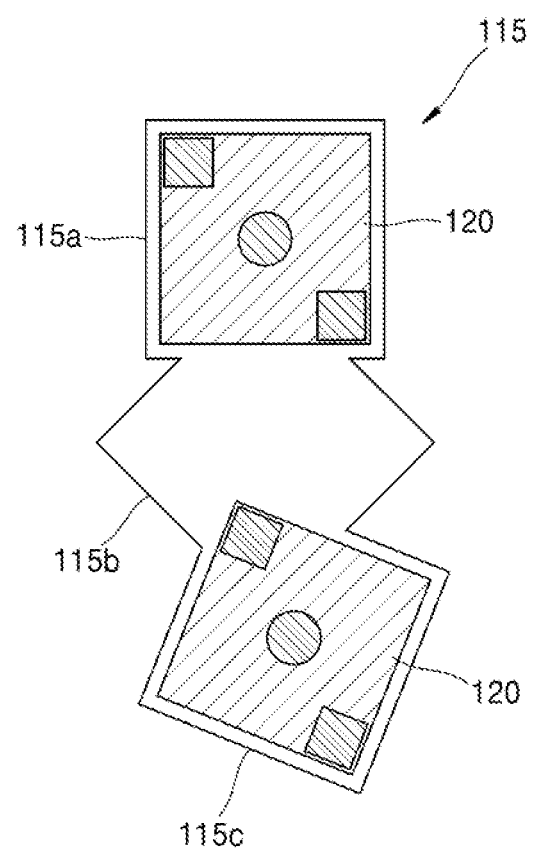

In addition, as illustrated in FIGS. 12A and 12B, the first region 115a to the third region 115c may be disposed such that the periphery of a vertex of the first figure and the periphery of one vertex of the second figure overlap each other and the periphery of the opposite vertex of the second figure and the periphery of a vertex of the third figure overlap each other. Alternatively, as illustrated in FIGS. 12C and 12D, the first region 115a to the third region 115c may be disposed such that the periphery of a side of the first figure and the periphery of one vertex of the second figure overlap each other and the periphery of the opposite vertex of the second figure and the periphery of a side of the third figure overlap each other. Also, the first figure and the third figure may be in a shape rotated relative to each other.

When one recess 115 has three or more regions which overlap each other, the light emitting device 120 may be disposed in at least one of the first region 115a to the third region 115c. As shown in FIGS. 12A and 12C, when the light emitting device 120 is disposed in the second region 115b in the middle, the light emitting device 120 is not disposed in the first and third regions 115a and 115c. As shown in FIGS. 12B and 12D, when the light emitting device 120 is disposed in the first region 115a, the light emitting device 120 may not be disposed in the second region 115b but may be further disposed in the third region 115c. In addition, when the light emitting device 120 is disposed in the third region 115c, the light emitting device 120 may not be disposed in the second region 115b but may be disposed in the first region 115a. In other words, the light emitting device 120 may be disposed only in the second region 115b or may be disposed in at least one of the first region 115a and the third region 115c. Accordingly, when the recess 115 includes n regions and each of the n regions overlaps with another adjacent region (n is a natural number greater than 2), 1 to n−1 light emitting devices 120 may be disposed in one recess 115.

Figure 13A:
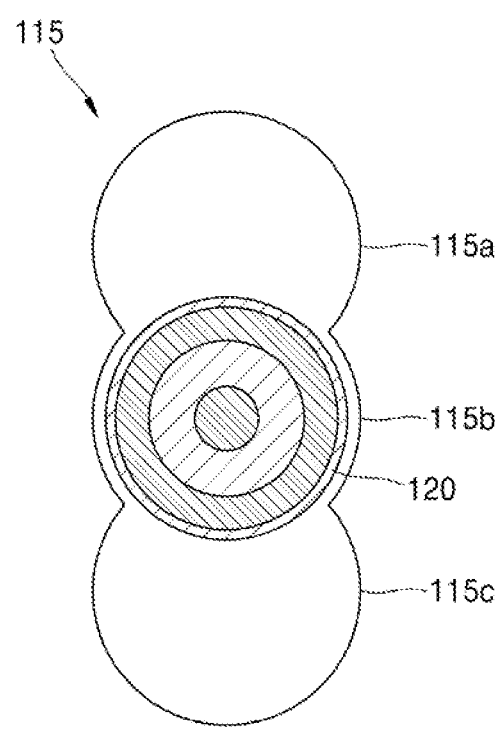
FIGS. 13A to 13C are plan views illustrating a shape of a recess of a device transfer substrate according to an embodiment.
Figure 13B:
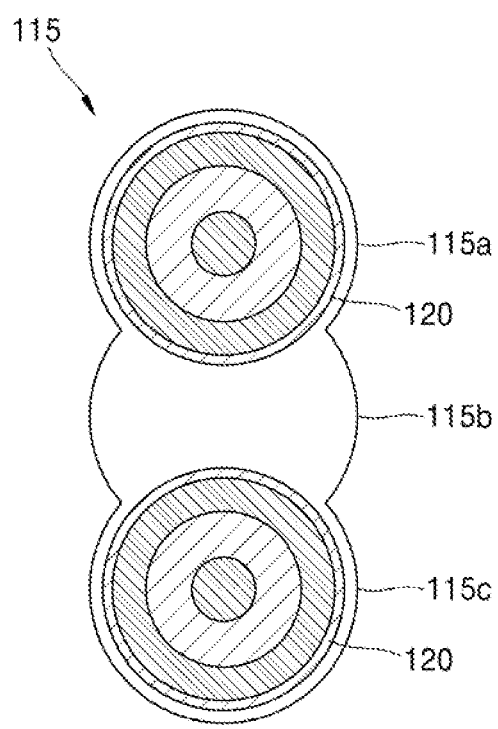
Figure 13C:
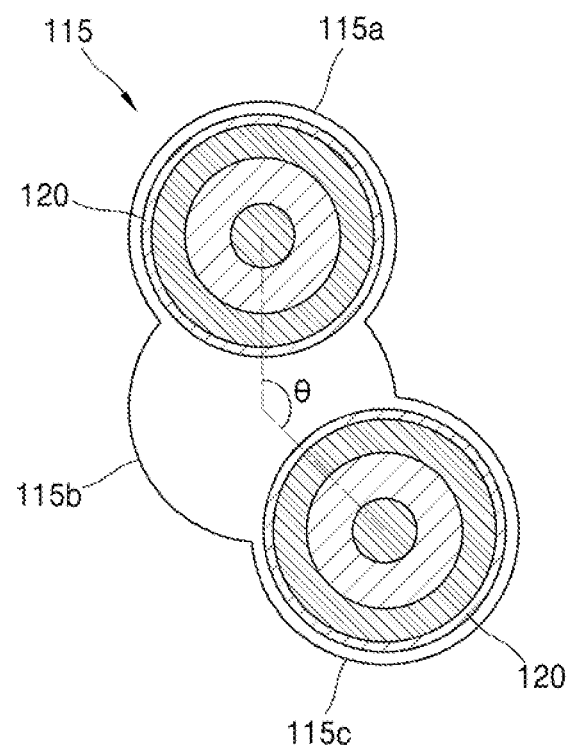

FIGS. 13A to 13C are plan views illustrating a shape of the recess 115 of the device transfer substrate according to an embodiment. Referring to FIGS. 13A to 13C, the first to third figures of the first to third regions 115a, 115b, and 115c may be circles. Even in this case, descriptions given above with reference to FIGS. 12A to 12D may be applied as they are. As shown in FIGS. 13A and 13B, the centers of the first to third figures may be positioned on a straight line. However, the disclosure is not necessarily limited thereto. For example, as illustrated in FIG. 13C, an angle θ between a line segment connecting the center of the first figure to the center of the second figure and a line segment connecting the center of the second figure to the center of the third figure may be in a range from 90 degrees to 180 degrees.

Figure 14A:
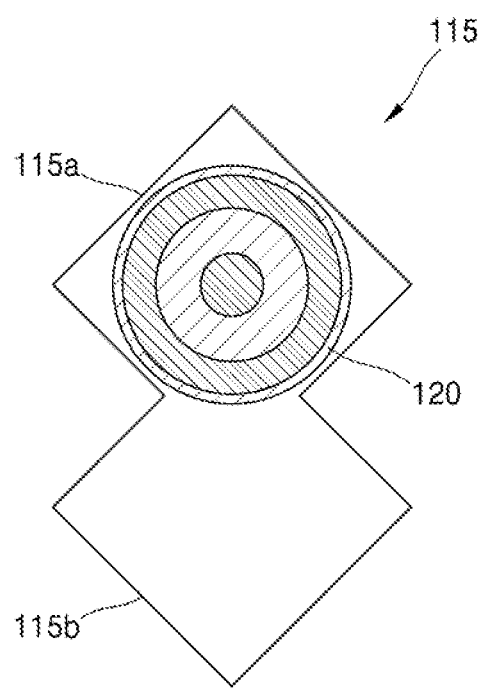
FIGS. 14A to 14C are plan views illustrating a shape of a recess of a device transfer substrate and a shape of a light emitting device according to an embodiment.
Figure 14B:
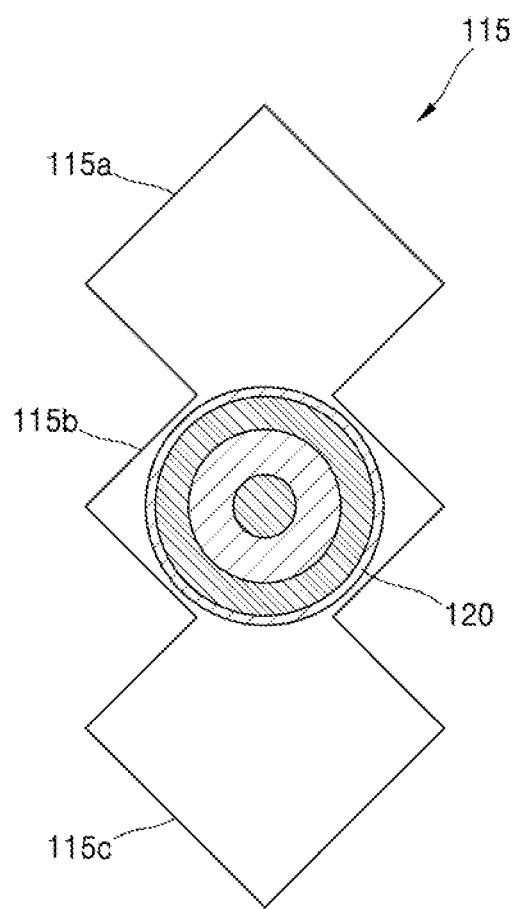
Figure 14C:
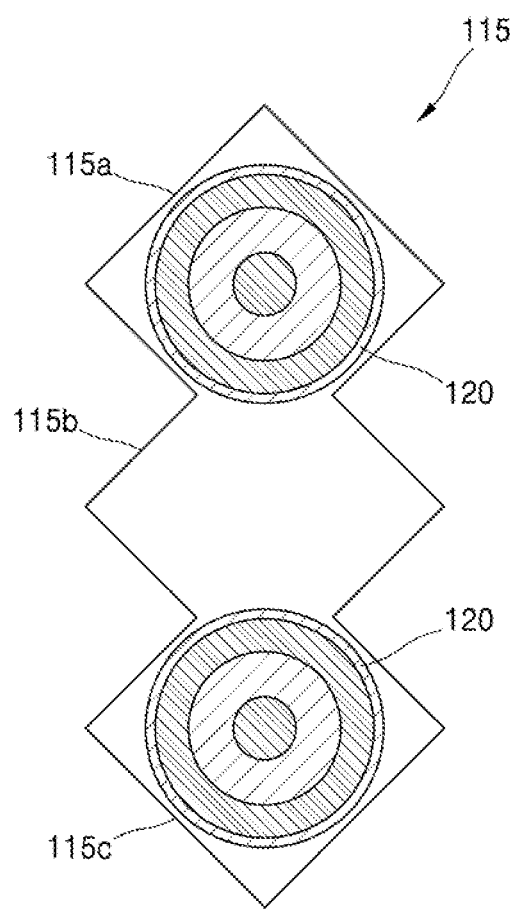

FIGS. 14A to 14C are plan views illustrating a shape of the recess 115 of the device transfer substrate 110 and a shape of the light emitting device 120 according to an embodiment. In the embodiments described above, the shape of the light emitting device 120 is similar to the shape of the figures of the respective regions of the recess 115, but is not necessarily limited thereto. For example, the first to third figures of the first to third regions 115a, 115b, and 115c may have a square shape, and the light emitting device 120 may have a circular shape. The shape of the recess 115 and the shape of the light emitting device 120 may be a combination of other shapes not illustrated in FIGS. 14A to 14C. The first to third figures may have any shape and size in which the light emitting device 120 may be stably positioned in each of the first to third regions 115a, 115b, and 115c.

The light emitting devices 120 arranged on the device transfer substrate 110 may be transferred onto a display substrate of the display apparatus to manufacture the display apparatus. In this case, the device transfer substrate 110 may be a transfer substrate for transferring the light emitting devices 120 onto the display substrate of the display apparatus. FIG. 15 is a cross-sectional view schematically illustrating a process of transferring the light emitting device 120 arranged on the device transfer substrate 110 onto a display substrate 210.

Referring to FIG. 15, the display substrate 210 may include a plurality of first electrode pairs 211 respectively disposed in regions on the display substrate 210 corresponding to the first regions 115a of the recesses 115 and a plurality of second electrode pairs 212 respectively disposed in regions on the display substrate 210 corresponding to the second regions 115b of the recesses 115. Each of the first electrode pairs 211 may include a first driving electrode 211a and a second driving electrode 211b, and each of the second electrode pairs 212 may include a third driving electrode 212a and a fourth driving electrode 212b. When the light emitting devices 120 arranged in the recesses 115 of the device transfer substrate 110 are transferred to the display substrate 210, it is not known in advance in which of the first region 115a and the second region 115b the light emitting device 120 is positioned, and thus, the first electrode pair 211 and the second electrode pair 212 may be provided at a position on the display substrate 210 corresponding to the first region 115a and a position on the display substrate 210 corresponding to the second region 115b, respectively.

The light emitting device 120 may be electrically connected to any one of the first electrode pair 211 and the second electrode pair 212. For example, the light emitting device 120 disposed in the first region 115a is electrically connected to the first electrode pair 211 and may not be electrically connected to the second electrode pair 212. Also, the light emitting device 120 disposed in the second region 115b may not be electrically connected to the first electrode pair 211 but may be electrically connected to the second electrode pair 212. In other words, the light emitting device 120 may be electrically connected to only any one of the first electrode pair 211 and the second electrode pair 212 in the region on the display substrate 210 corresponding to one recess 115 and may not be electrically connected to the other one of the first electrode pair 211 and the second electrode pair 212.

The display substrate 210 may further include a driving circuit including a plurality of thin film transistors (TFTs) for independently controlling the light emitting devices 120. For example, the thin film transistors may be disposed below the first electrode pair 211 and the second electrode pair 212 in the display substrate 210, and the thin film transistors may be electrically connected to the first and second electrode pairs 211 and 212 through wirings. In particular, a driving circuit may be configured to apply the same driving signal simultaneously to the first electrode pair 211 and the second electrode pair 212 respectively disposed in regions corresponding to one recess 115 on the display substrate 210. Then, the light emitting device 120 disposed in each of the recesses 115 may operate as if the light emitting device 120 is at the same position or at the same sub-pixel on the display substrate 210 no matter in which of the first region 115a and the second region 115b the light emitting device 120 is positioned.

The device transfer substrate 110 may be disposed such that the first and second device electrodes 125 and 126 of the light emitting device 120 face the display substrate 210. In addition, the device transfer substrate 110 may press the display substrate 210 such that the first device electrode 125 of the light emitting device 120 comes into contact with the first driving electrode 211a or the third driving electrode 212a and the second device electrode 126 comes into contact with the second driving electrode 211b or the fourth driving electrode 212b. Thereafter, the first device electrode 125 may be bonded to the first driving electrode 211a or the third driving electrode 212a and the second device electrode 126 to the second driving electrode 211b or the fourth driving electrode 212b, through a bonding material such as a solder bump. In this manner, when the light emitting device 120 is completely fixed to the display substrate 210, the device transfer substrate may be detached from the light emitting device 120.

According to the embodiment described above, the light emitting devices 120 may be transferred onto the device transfer substrate 110 or the display substrate 210 with a high yield, while using a relatively small amount of the light emitting devices 120. Accordingly, manufacturing costs for a display apparatus including a very large number of light emitting devices 120 may be reduced.

Figure 16A:
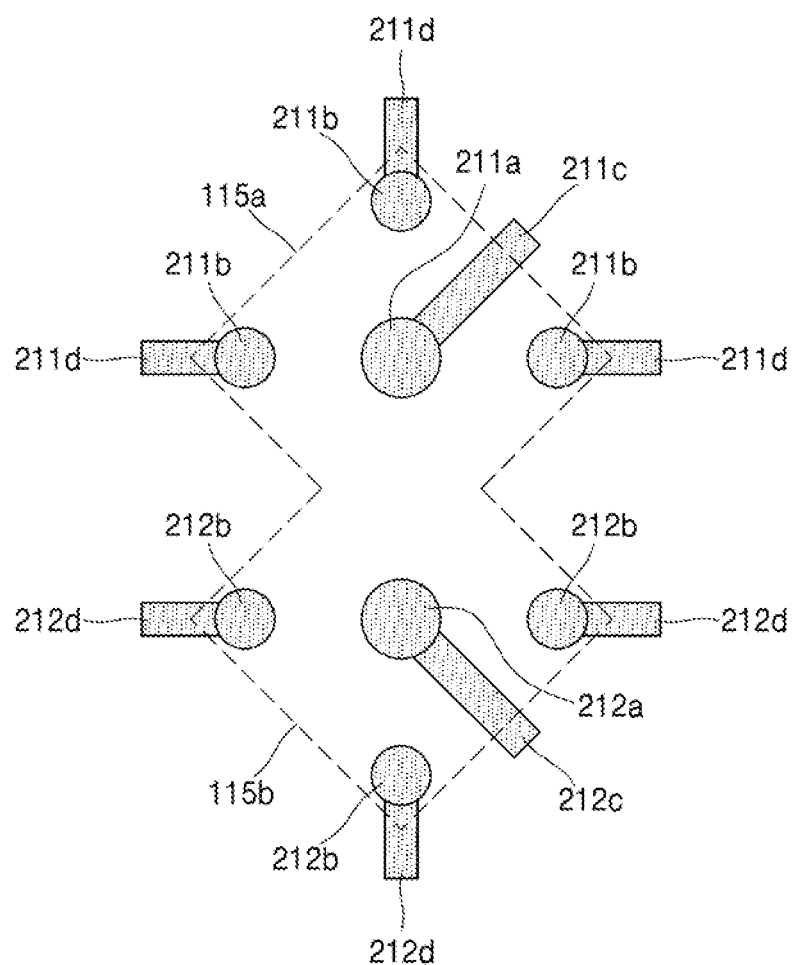
FIGS. 16A to 16C are plan views illustrating various arrangements of electrode pairs that may be electrically connected to a light emitting device transferred on a display substrate.
Figure 16B:
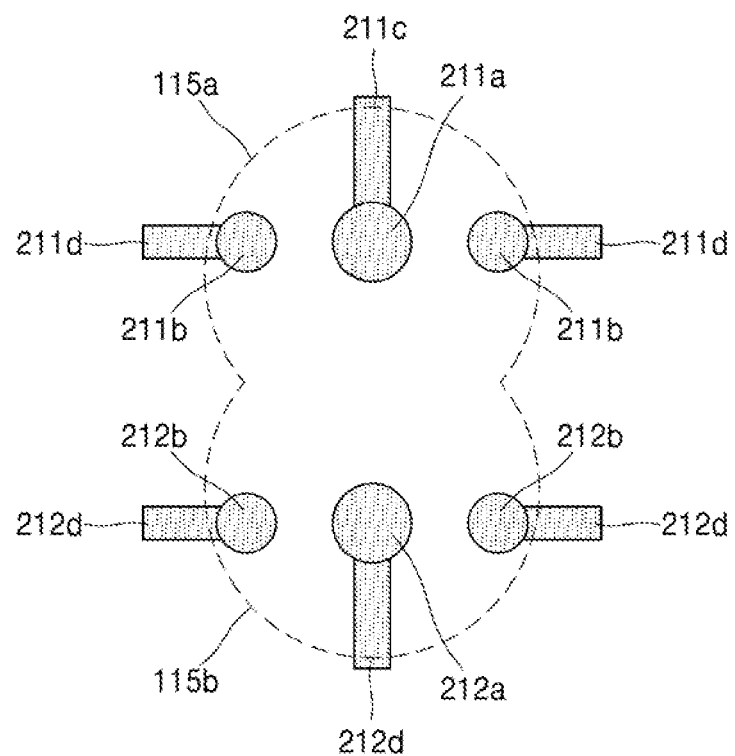
Figure 16C:
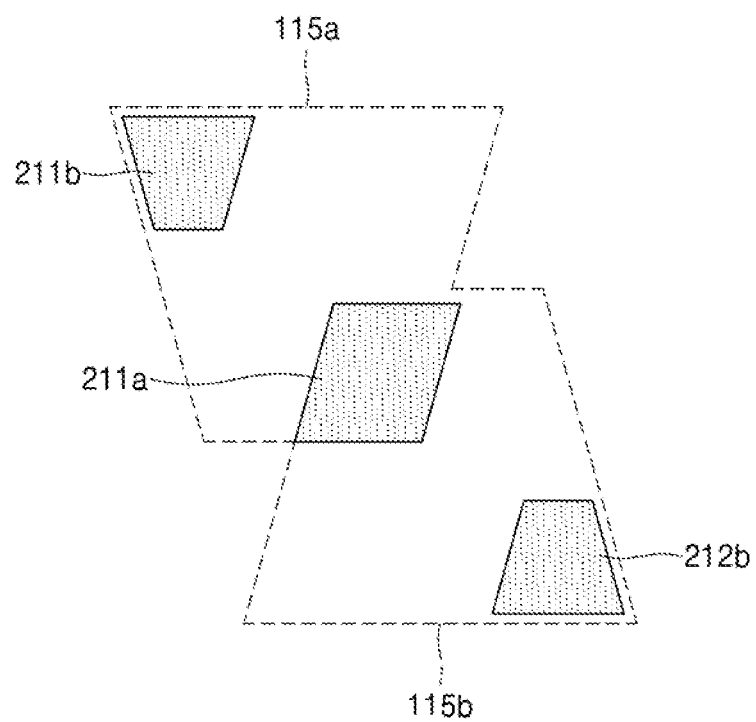

FIGS. 16A to 16C are plan views illustrating various arrangements of electrode pairs that may be electrically connected to the light emitting device 120 transferred on the display substrate 210.

Referring to FIG. 16A, when the light emitting device 120 has a square shape and the first and second shapes of the first and second regions 115a and 115b of the recess 115 have a square shape, the first driving electrode 211a and the third driving electrode 212a may be disposed at positions corresponding to the center of the first figure and the center of the second figure on the display substrate 210, respectively. In addition, the second driving electrode 211b may be disposed at positions respectively corresponding to the three vertices of the first figure that are not positioned in the overlapping region, on the display substrate 210, the fourth driving electrode 212b may be disposed at positions respectively corresponding to the three vertices of the second figure that are not positioned in the overlapping region, on the display substrate 210.

A first wiring 211c and a third wiring 212c may be connected to the first driving electrode 211a and the third driving electrode 212a, respectively. The first wiring 211c may extend between two adjacent second driving electrodes 211b on the display substrate 210 or extend below the display substrate 210 through a via hole, and the third wiring 212c may extend between two adjacent fourth driving electrodes 212b on the display substrate 210 or extend below the display substrate 210 through a via hole. Also, a second wiring 211d and a fourth wiring 212d may be connected to the second driving electrode 211b and the fourth driving electrode 212b, respectively. The second wiring 211d may extend in an outward direction of the first figure from the display substrate 210 or extend below the display substrate 210 through a via hole, and the fourth wiring 212d may extend in an outward direction of the second figure from the display substrate 210 or extend below the display substrate 210 through a via hole. According to this electrode arrangement method, first to fourth driving electrodes 211a, 211b, 212a, and 212b may be disposed apart from each other without a possibility of a short-circuit.

Referring to FIG. 16B, when the light emitting device 120 has a circular shape and the first and second figures of the first and second regions 115a and 115b of the recess 115 have a circular shape, the first driving electrode 211a and the third driving electrode 212a may be disposed at positions corresponding to the center of the first figure and the center of the second figure, respectively. In addition, two or more second driving electrodes 211b are disposed at positions corresponding to the edge portion of the first figure that are not positioned in the overlapping region, on the display substrate 210 and two or more fourth driving electrodes 212b may be disposed at positions corresponding to the edge portion of the second figure that are not positioned in the overlapping region, on the display substrate 210.

Referring to FIG. 16C, the light emitting device 120 has a trapezoidal shape, the first and second figures of the first and second regions 115a and 115b of the recess 115 have a trapezoidal shape, and the first region 115a and the second region 115b may be disposed such that the periphery of the vertex corresponding to the position of the first device electrode 125 of the light emitting device 120, among two vertices of the shorter side of the first and second figures, overlap each other. In this case, the first driving electrode 211a may be disposed at a position corresponding to the overlapping region 116 on the display substrate 210, and the second driving electrode 211b and the fourth driving electrode 212b may be disposed at positions corresponding to two vertices of the longer side of the first and second figures in a diagonal direction of the overlapping region 116 on the display substrate 210. In this configuration, the first electrode pair 211 and the second electrode pair 212 may share one first driving electrode 211a. In other words, the first electrode pair 211 may include the first driving electrode 211a and the second driving electrode 211b, and the second electrode pair 212 may include the first driving electrode 211a and the fourth driving electrode 212b.

Figure 17:
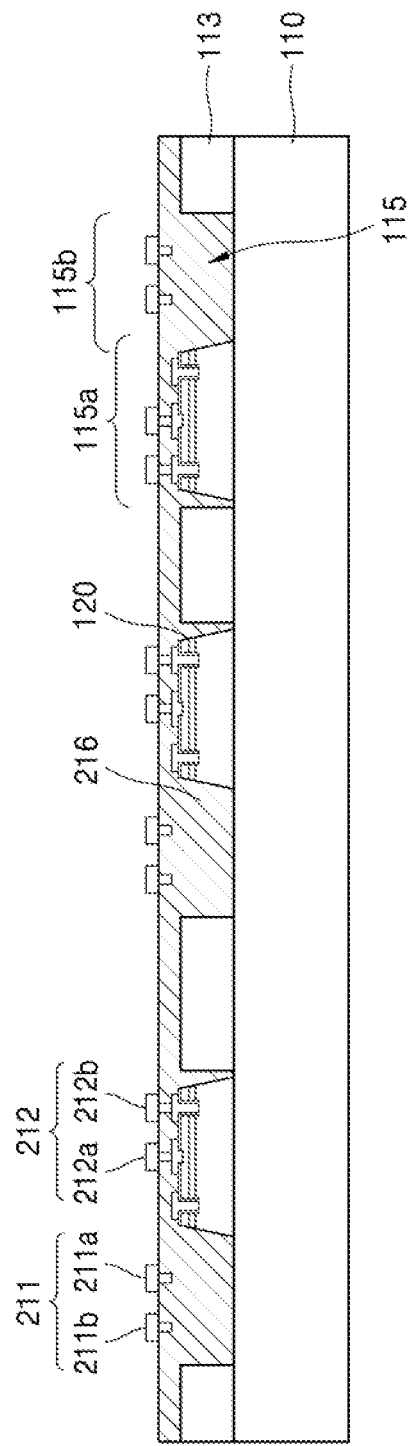
FIG. 17 is a cross-sectional view schematically illustrating an arrangement of electrode pairs on a device transfer structure according to an embodiment.

In addition, a display apparatus may be manufactured by directly disposing driving electrodes on the device transfer structure 100 illustrated in FIG. 1 without transferring the light emitting device 120 to a separate display substrate 210. In this case, the device transfer substrate 110 may have both a role of arranging the light emitting devices 120 and a role of a display substrate of the display apparatus. FIG. 17 is a cross-sectional view schematically illustrating the arrangement of electrode pairs on the device transfer structure 100 according to an embodiment. Referring to FIG. 17, an insulating layer 216 may be formed on the device transfer substrate 110 on which the light emitting devices 120 are arranged. In addition, a plurality of first electrode pairs 211 and a plurality of second electrode pairs 212 may be formed on the insulating layer 216. Because it is not known in advance in which of a first region 115a and a second region 115b the light emitting device 120 is positioned, the first electrode pair 211 and the second electrode pair 212 may be formed at a position corresponding to the first region 115a on the device transfer substrate 110 and a position corresponding to the second region 115b on the device transfer substrate 110, respectively.

The first electrode pair 211 may include the first driving electrode 211a and the second driving electrode 211b, and the second electrode pair 212 may include a third driving electrode 212a and a fourth driving electrode 212b. To be electrically connected to the light emitting device 120, the first to fourth driving electrodes 211a, 211b, 212a, and 212b may extend into the insulating layer 216. Then, any one of the first electrode pair 211 and the second electrode pair 212 in one recess 115 is electrically connected to the light emitting device 120, and the other is not electrically connected to any of the light emitting devices.

A driving circuit including TFTs for independently controlling the light emitting devices 120 may be further included in the device transfer substrate 110. Accordingly, the device transfer substrate 110 may serve as a display substrate of the display apparatus. The first to fourth driving electrodes 211a, 211b, 212a, and 212b may be connected to the driving circuit inside the device transfer substrate 110 through via holes passing through the insulating layer 216. Also, the arrangement of the driving electrodes illustrated in FIGS. 16A to 16C may be applied to the embodiment illustrated in FIG. 17.

Figure 18:
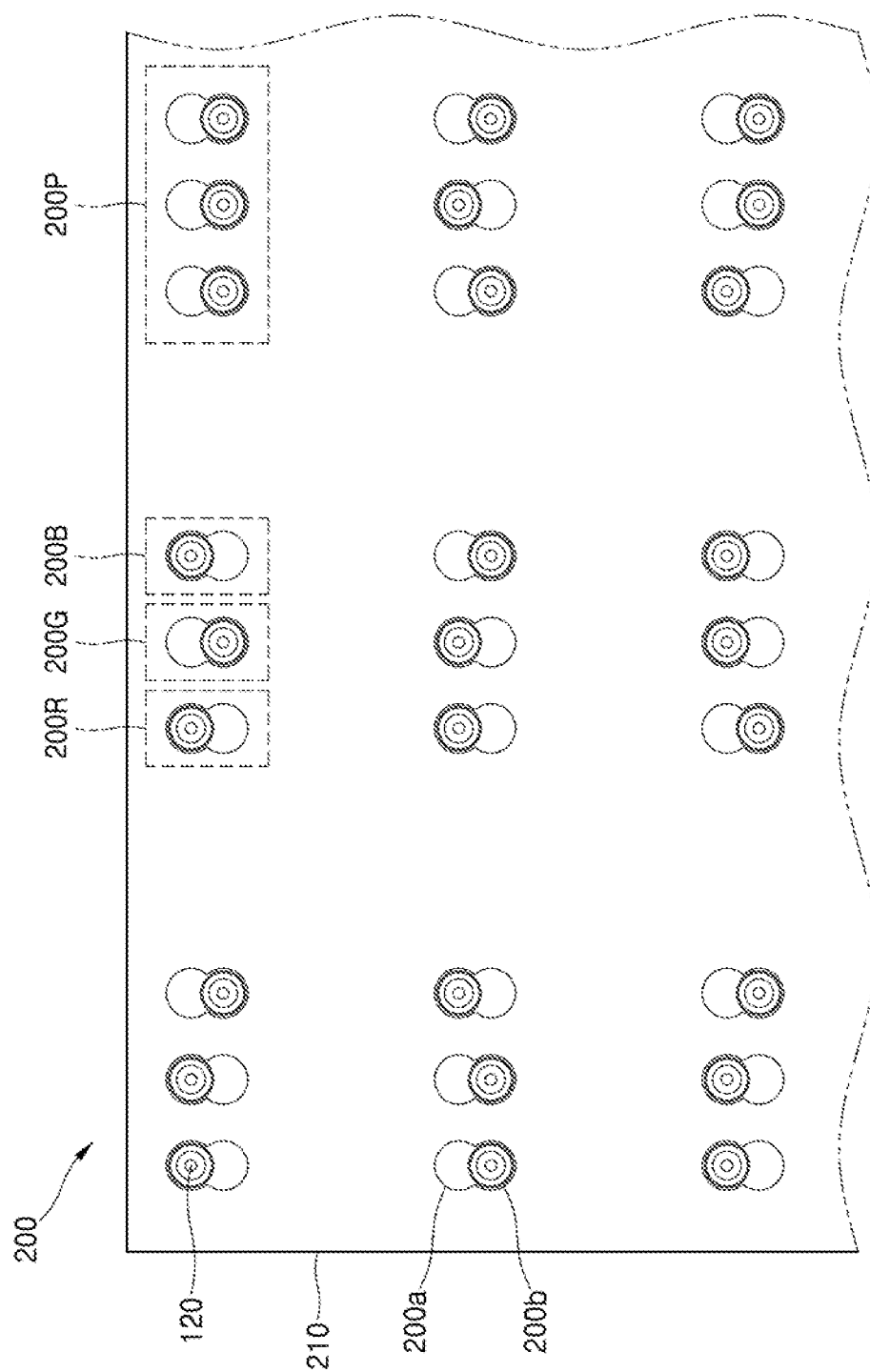
FIG. 18 is a plan view illustrating an arrangement of a plurality of light emitting devices on a display substrate of a display apparatus according to an embodiment.

FIG. 18 is a plan view illustrating an arrangement of the light emitting devices 120 on the display substrate 210 of a display apparatus 200 according to an embodiment. Referring to FIG. 18, the display apparatus 200 may include the display substrate 210 including a plurality of two-dimensionally arranged pixels 200P and light emitting devices 120 disposed on the display substrate 210. Each pixel 200P may include three sub-pixels 200R, 200G, and 200B disposed adjacent to each other. Accordingly, the display substrate 210 may include a plurality of sub-pixels 200R, 200G, and 200B that are two-dimensionally arranged on the display substrate 210. The sub-pixels 200R, 200G, and 200B may emit red light, green light, and blue light, respectively.

Each of the sub-pixels 200R, 200G, and 200B may include a first region 200*a* and a second region 200*b* that partially overlap each other on the display substrate 210. The first region 200*a* and the second region 200*b* of the sub-pixels 200R, 200G, and 200B may respectively correspond to the first region 115*a* and the second region 115*b* of the recess 115 of the device transfer substrate 110. As illustrated in FIG. 18, the plurality of light emitting devices 120 may be irregularly arranged in any one of the first region 200*a* and the second region 200*b* of the sub-pixels 200R, 200G, and 200B.

As described above with reference to FIGS. 15 and 17, the display apparatus 200 may further include a first electrode pair 211 including a first driving electrode 211*a* and a second driving electrode 211*b* disposed in the first region 200*a* and a second electrode pair 212 including a third driving electrode 212*a* and a fourth driving electrode 212*b* disposed in the second region 200*b*. The light emitting device 120 disposed in the first region 200*a* may be electrically connected to the first electrode pair 211 but may not be electrically connected to the second electrode pair 212, and the light emitting device 120 disposed in the second region 200*b* may not be electrically connected to the first electrode pair 211 but may be electrically connected to the second electrode pair 212.

Figure 19:
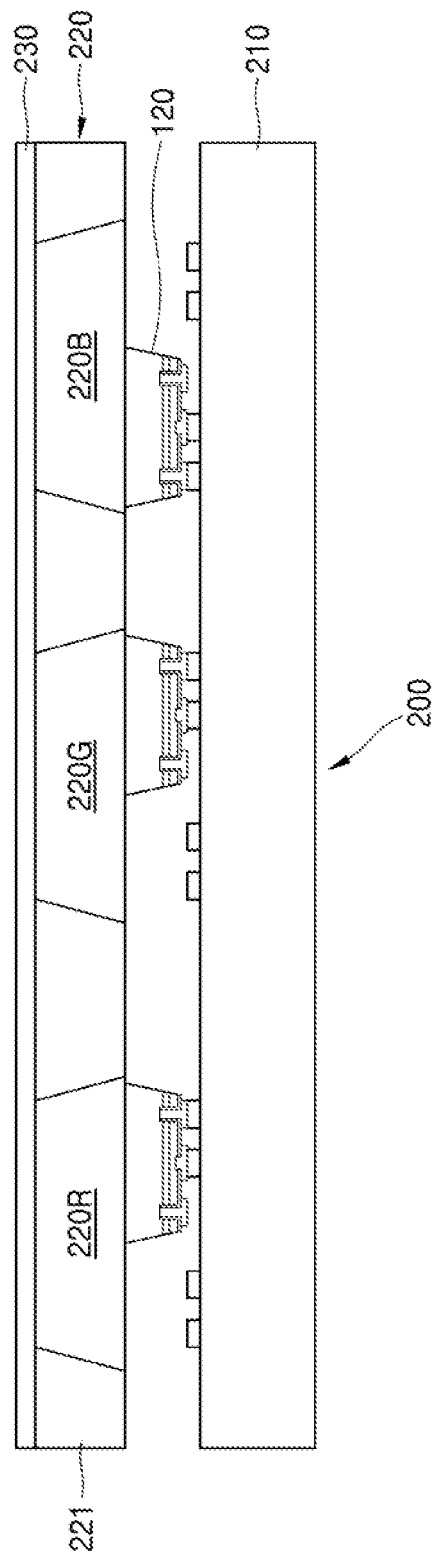
FIG. 19 is a cross-sectional view schematically illustrating a structure of a display apparatus according to an embodiment.

FIG. 19 is a cross-sectional view schematically illustrating a structure of a display apparatus 200 according to an embodiment. Referring to FIG. 19, the display apparatus 200 may include the display substrate 210, the light emitting devices 120 mounted on the display substrate 210, and a wavelength conversion layer 220 disposed on the light emitting devices 120. In addition, the display apparatus 200 may further include an upper substrate 230 disposed on the wavelength conversion layer 220. The wavelength conversion layer 220 may include a first wavelength conversion layer 220R converting light emitted from the light emitting device 120 into light having a first wavelength band, a second wavelength conversion layer 220G converting the light emitted from the light emitting device 120 into light having a second wavelength band different from the first wavelength band, and a third wavelength conversion layer 220B converting the light emitted from the light emitting device 120 into light having a third wavelength band that is different from the first and second wavelength bands. For example, the light having the first wavelength band may be red light, the light having the second wavelength band may be green light, and the light having the third wavelength band may be blue light. The first wavelength conversion layer 220R, the second wavelength conversion layer 220G, and the third wavelength conversion layer 220B may be apart from each other with a partition 221 therebetween and may face corresponding semiconductor light emitting devices 120, respectively.

When the light emitting device 120 emits blue light, the third wavelength conversion layer 220B may include a resin that transmits blue light. The second wavelength conversion layer 220G may convert blue light emitted from the light emitting device 120 to emit green light. The second wavelength conversion layer 220G may include quantum dots or phosphor excited by blue light to emit green light. The first wavelength conversion layer 220R may change blue light emitted from the light emitting device 120 into red light to be emitted. The first wavelength conversion layer 220R may include quantum dots or phosphor excited by blue light to emit red light.

The quantum dots included in the first wavelength conversion layer 220R or the second wavelength conversion layer 220G may have a core-shell structure having a core portion and a shell portion or may have a particle structure without a shell. The core-shell structure may include a single shell structure or a multi-shell structure, e.g., a double-shell structure. The quantum dots may include a group II-VI series semiconductor, a group III-V series semiconductor, a group IV-VI series semiconductor, a group IV series semiconductor, and/or graphene quantum dots. The quantum dots may include, for example, Cd, Se, Zn, S, and/or InP, and each quantum dot may have a diameter of tens of nm or less, for example, a diameter of about 10 nm or less. The quantum dots included in the first wavelength conversion layer 220R and the second wavelength conversion layer 220G may have different sizes.

Figure 20:
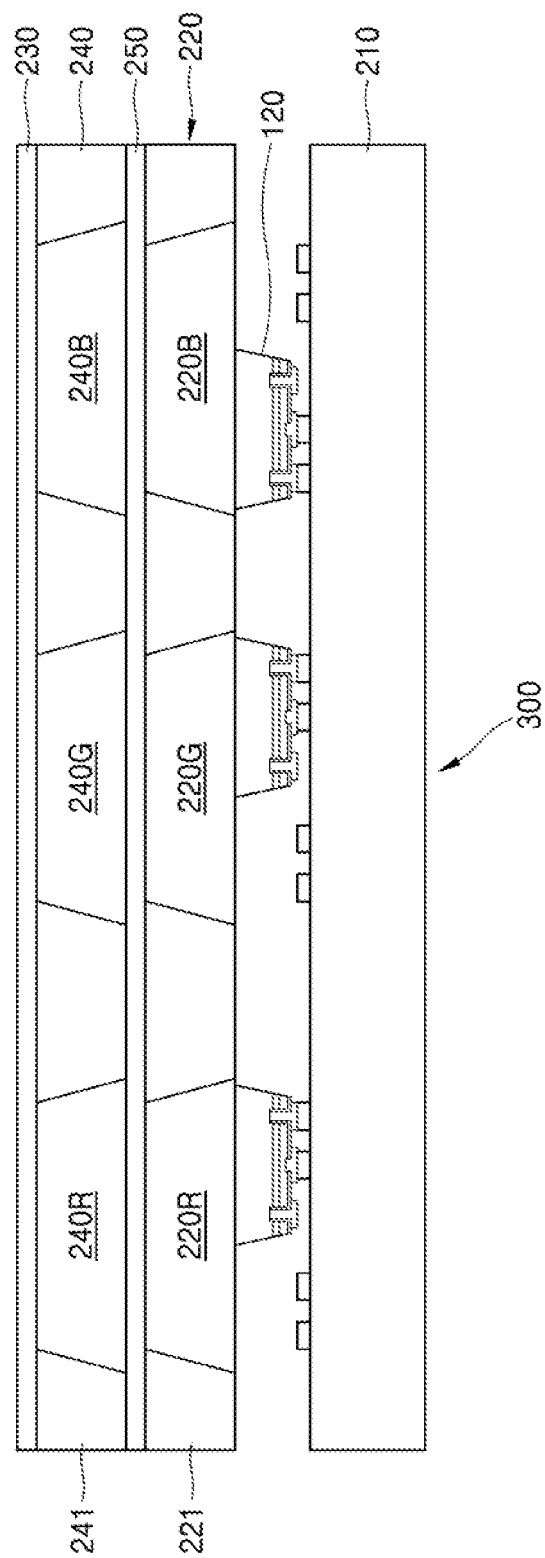
FIG. 20 is a cross-sectional view schematically illustrating a structure of a display apparatus according to an embodiment.

FIG. 20 is a cross-sectional view schematically illustrating a structure of a display apparatus 300 according to an embodiment. Referring to FIG. 20, the display apparatus 300 may further include a capping layer 250 on the wavelength conversion layer 220 and a color filter layer 240 on the capping layer 250. The capping layer 250 and the color filter layer 240 may be disposed between the wavelength conversion layer 220 and the upper substrate 230 of the display apparatus 200 illustrated in FIG. 19. The color filter layer 240 includes a first filter 240R, a second filter 240G, and a third filter 240B apart from each other with a black matrix 241 therebetween. The first filter 240R, the second filter 240G, and the third filter 240B face the first wavelength conversion layer 220R, the second wavelength conversion layer 220G, and the third wavelength conversion layer 220B, respectively. The first filter 240R, the second filter 240G, and the third filter 240B transmit red light, green light, and blue light, respectively, and absorb light of other colors. When the color filter layer 240 is provided, light other than red light emitted without wavelength conversion from the first wavelength conversion layer 220R or light other than green light emitted without wavelength conversion from the second wavelength conversion layer 220G may be removed by the first filter 240R and the second filter 240G, respectively, thereby increasing color purity of the display apparatus 300.

Figure 21:
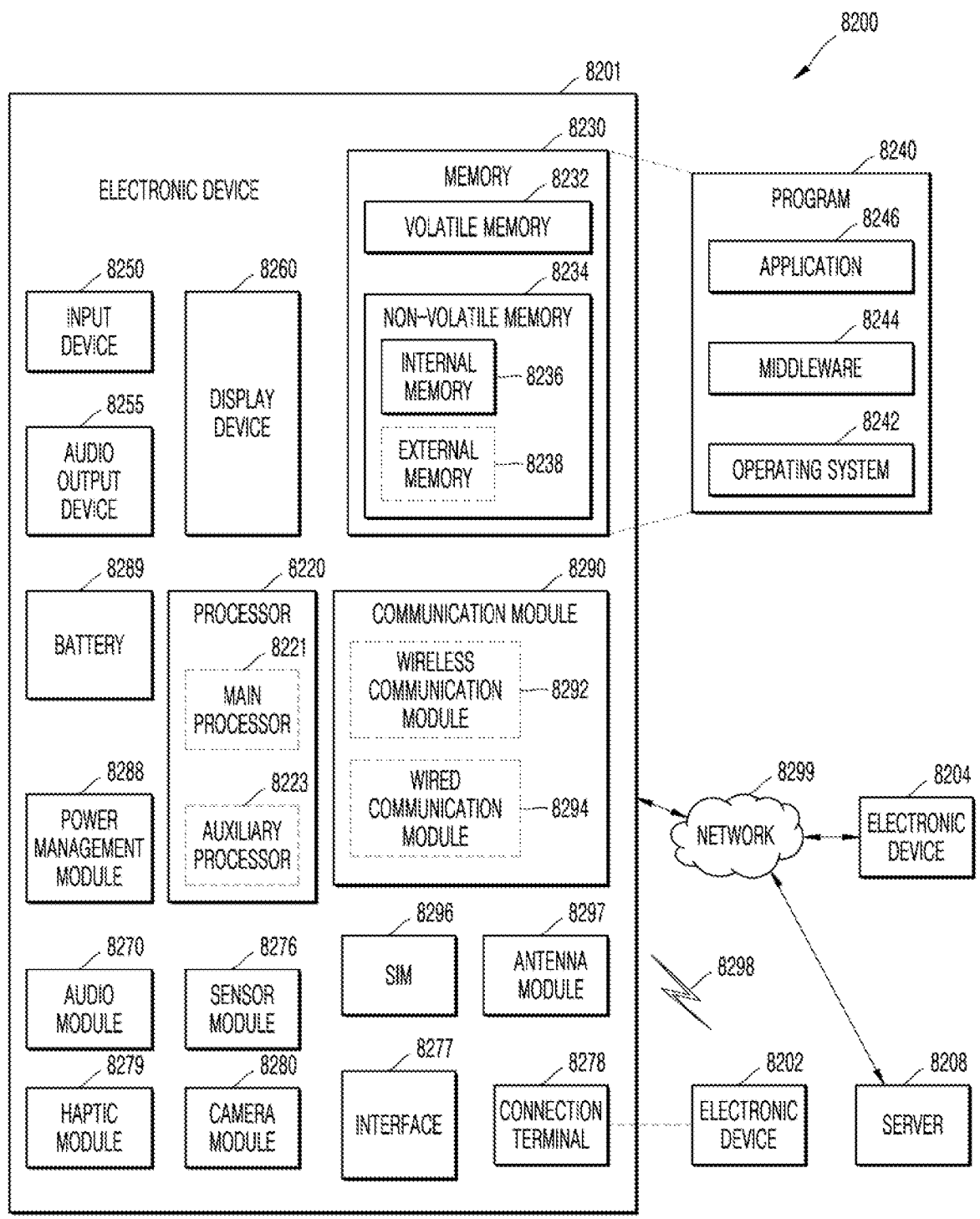
FIG. 21 is a schematic block diagram of an electronic device according to an embodiment.

The display apparatuses described above may be applied to various electronic devices having a screen display function. FIG. 21 is a schematic block diagram of an electronic device 8201 according to an embodiment. Referring to FIG. 21, the electronic device 8201 may be provided in a network environment 8200. In the network environment 8200, the electronic device 8201 may communicate with another electronic device 8202 through a first network 8298 (a short-range wireless communication network, etc.), or may communicate with another electronic device 8204 and/or a server 8208 through a second network 8299 (a long-range wireless communication network, etc.). The electronic device 8201 may communicate with the electronic device

8204 through the server 8208. The electronic device 8201 may include a processor 8220, a memory 8230, an input device 8250, an audio output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of these components of the electronic device 8201 may be omitted or other components may be added to the electronic device 8201. Some of these components may be implemented as one integrated circuit. For example, the sensor module 8276 (a fingerprint sensor, an iris sensor, an illuminance sensor, etc.) may be included in the display apparatus 8260 (display, etc.).

The processor 8220 may execute software (a program 8240, etc.) to control one or a plurality of other components (hardware, software components, etc.) among electronic devices 8201 connected to the processor 8220 and perform various data processing or operations. As part of the data processing or operations, the processor 8220 may load instructions and/or data received from other components (the sensor module 8276, the communication module 8290, etc.) into a volatile memory 8232, process instructions and/or data stored in the volatile memory 8232, and store result data in a nonvolatile memory 8234. The nonvolatile memory 8234 may include an internal memory 8236 mounted in the electronic device 8201 and a detachable external memory 8238. The processor 8220 may include a main processor 8221 (a central processing unit, an application processor, etc.) and an auxiliary processor 8223 (a graphics processing unit, an image signal processor, a sensor hub processor, a communication processor, etc.) that may be operated independently or together with the main processor 8221. The auxiliary processor 8223 may use less power than the main processor 8221 and may perform specialized functions.

The auxiliary processor 8223 may control functions and/or states related to some (the display apparatus 8260, the sensor module 8276, the communication module 8290, etc.) of the components of the electronic device 8201 in place of the main processor 8221 while the main processor 8221 is inactive (a sleep state) or together with the main processor 8221 while the main processor 8221 is active (an application executed state). The auxiliary processor 8223 (an image signal processor, a communication processor, etc.) may be implemented as part of other functionally related components (the camera module 8280, the communication module 8290, etc.).

The memory 2230 may store various data required by the components (the processor 8220, the sensor module 8276, etc.) of the electronic device 8201. The data may include, for example, software (the program 8240, etc.) and input data and/or output data for commands related thereto. The memory 8230 may include the volatile memory 8232 and/or the nonvolatile memory 8234.

The program 8240 may be stored as software in the memory 8230 and may include an operating system 8242, middleware 8244, and/or an application 8246.

The input device 8250 may receive commands and/or data to be used by components (the processor 8220, etc. of the electronic device 8201) from the outside (a user, etc.) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as part of the speaker or may be implemented as an independent separate device.

The display apparatus 8260 may visually provide information to the outside of the electronic device 8201. The display apparatus 8260 may include a display, a hologram device, or a projector, and a control circuit for controlling a corresponding device. The display apparatus 8260 may include the driving circuit, the light emitting device, a side reflective structure, a lower reflective structure, etc. The display apparatus 8260 may further include touch circuitry configured to detect a touch and/or a sensor circuit (a pressure sensor, etc.) configured to measure the strength of a force generated by the touch.

The audio module 8270 may convert sound into an electrical signal, or conversely, may convert an electrical signal into sound. The audio module 8270 may acquire sound through the input device 8250 and output sound through a speaker and/or a headphone of another electronic device (the electronic device 8202, etc.) connected to the audio output device 8255 and/or the electronic device 8201 directly or wirelessly.

The sensor module 8276 may detect an operating state (power, temperature, etc.) of the electronic device 8201 or an external environmental state (a user state, etc.), and generate an electrical signal and/or data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used for the electronic device 8201 to be connected to another electronic device (e.g., the electronic device 8202) directly or wirelessly. The interface 8277 may include a high definition multimedia interface (HDMI), a universal serial bus (USB) interface, an SD card interface, and/or an audio interface.

A connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and video. The camera module 8280 may include a lens assembly including one or more lenses, image sensors, image signal processors, and/or flashes. The lens assembly included in the camera module 8280 may collect light emitted from a subject to be imaged.

The power management module 8288 may manage power supplied to the electronic device 8201. The power management module 8288 may be implemented as part of a power management integrated circuit (PMIC).

The battery 8289 may supply power to components of the electronic device 8201. The battery 8289 may include a non-rechargeable primary cell, a rechargeable secondary cell, and/or a fuel cell.

The communication module 8290 may establish a direct (wired) communication channel and/or a wireless communication channel between the electronic device 8201 and other electronic devices (the electronic device 8202, the electronic device 8204, the server 8208, etc.) and support communication through the established communication channel. The communication module 8290 may include one or more communication processors operating independently of the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module, etc.) and/or a wired communication module 8294 (a local area network (LAN) communication module, a power line communication module, etc.). Among these communication modules, a corresponding communication module may communicate with another electronic device through the first network 8298 (a short-range communication network such as Bluetooth, WiFi Direct, or infrared Data Association (IrDA) or the second network 8299 (a telecommunication network such as a cellular network, the Internet, or a computer network (LAN), WAN, etc.). These various types of communication modules may be integrated into one component (a single chip, etc.) or may be implemented as a plurality of components (multiple chips) separate from each other. The wireless communication module 8292 may verify and authenticate the electronic device 8201 in the communication network such as the first network 8298 and/or the second network 8299 using subscriber information (an international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator including a conductive pattern formed on a board (a printed circuit board (PCB), etc.). The antenna module 8297 may include one or a plurality of antennas. When a plurality of antennas are included, an antenna suitable for a communication method used in a communication network such as the first network 8298 and/or the second network 8299 may be selected from among the plurality of antennas by the communication module 8290. Signals and/or power may be transmitted or received between the communication module 8290 and other electronic devices through the selected antenna. A component (an RFIC, etc.) other than the antenna may be included as part of the antenna module 8297.

Some of the components may be connected to each other through communication methods (a bus, a general purpose input and output (BPIO), a serial peripheral interface (SPI), a mobile industry processor interface (MIPI)) and exchange signals (commands, data, etc.) with each other.

The command or data may be transmitted or received between the electronic device 8201 and the electronic device 8204 through the server 8208 connected to the second network 8299. The other electronic devices 8202 and 8204 may be the same or different types of devices as the electronic device 8201. All or some of the operations executed by the electronic device 8201 may be executed by one or more of the other electronic devices 8202, 8204, and 8208. For example, when the electronic device 8201 needs to perform a function or service, the electronic device 8201 may request one or more other electronic devices to perform a portion or the entirety of the function or the service, instead of executing the function or service by itself. Upon receiving the request, one or more other electronic devices may execute an additional function or service related to the request, and transmit a result of the execution to the electronic device 8201. To this end, cloud computing, distributed computing, and/or client-server computing technology may be used.

Figure 22:
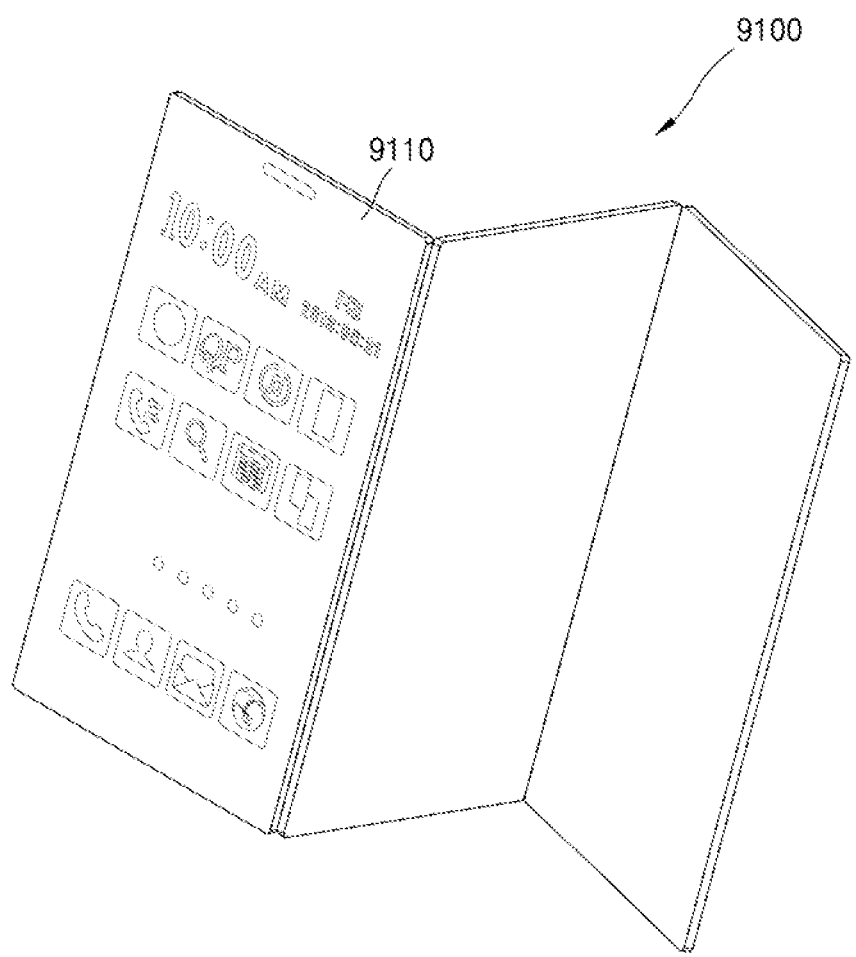
FIG. 22 illustrates an example in which a display apparatus according to embodiments is applied to a mobile device.

FIG. 22 illustrates an example in which a display apparatus according to embodiments is applied to a mobile device 9100. The mobile device 9100 may include a display apparatus 9110, and the display apparatus 9110 may include the driving circuit, the light emitting device, the side reflective structure, the lower reflective structure, and the like described above. The display apparatus 9110 may have a foldable structure, for example, a multi-foldable structure.

Figure 23:
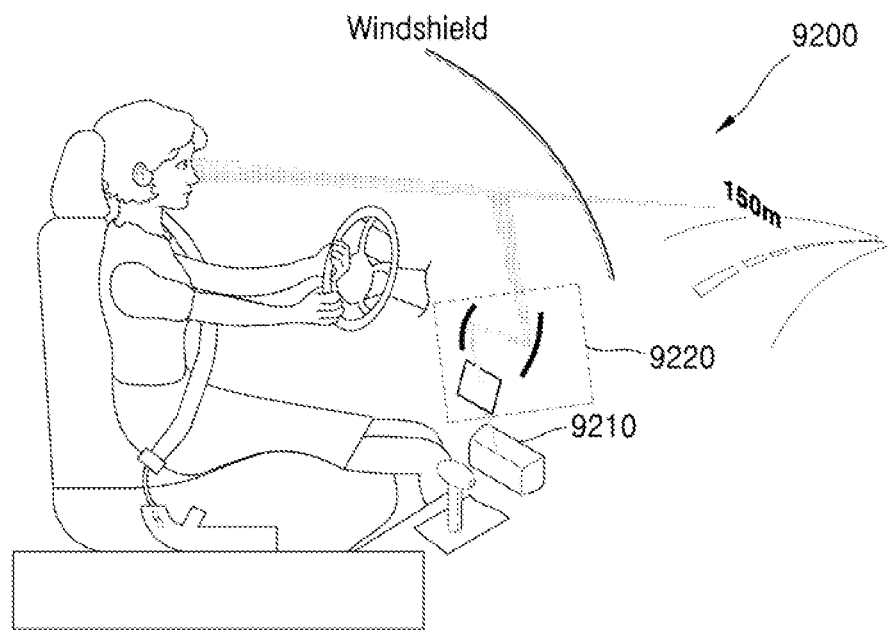
FIG. 23 illustrates an example in which a display apparatus according to embodiments is applied to a vehicle display apparatus.

FIG. 23 illustrates an example in which the display apparatus according to embodiments is applied to a vehicle display apparatus. The display apparatus may be a head-up display apparatus 9200 for a vehicle and may include a display 9210 provided in a region of a vehicle and a light path changing member 9220 for changing a path of light so that a driver may see an image generated by the display 9210.

Figure 24:
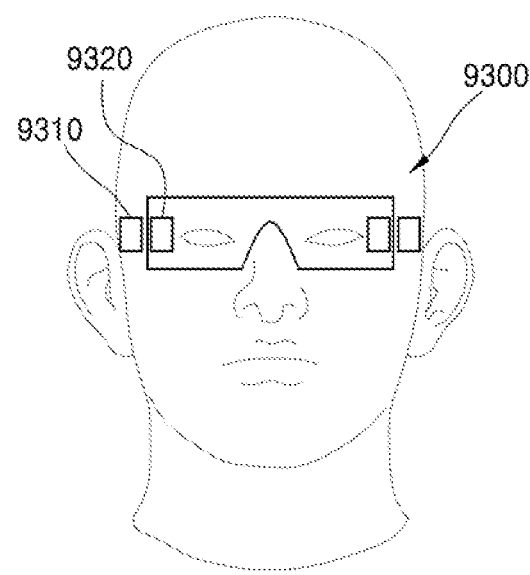
FIG. 24 illustrates an example in which a display apparatus according to embodiments is applied to augmented reality glasses or virtual reality glasses.

FIG. 24 illustrates an example in which the display apparatus according to embodiments is applied to augmented reality (AR) glasses 9300 or virtual reality glasses. The AR glasses 9300 may include a projection system 9310 forming an image and an element 9320 guiding the image from the projection system 9310 to a users eye. The projection system 9310 may include the driving circuit, the light emitting device, the side reflective structure, the lower reflective structure, and the like described above.

Figure 25:
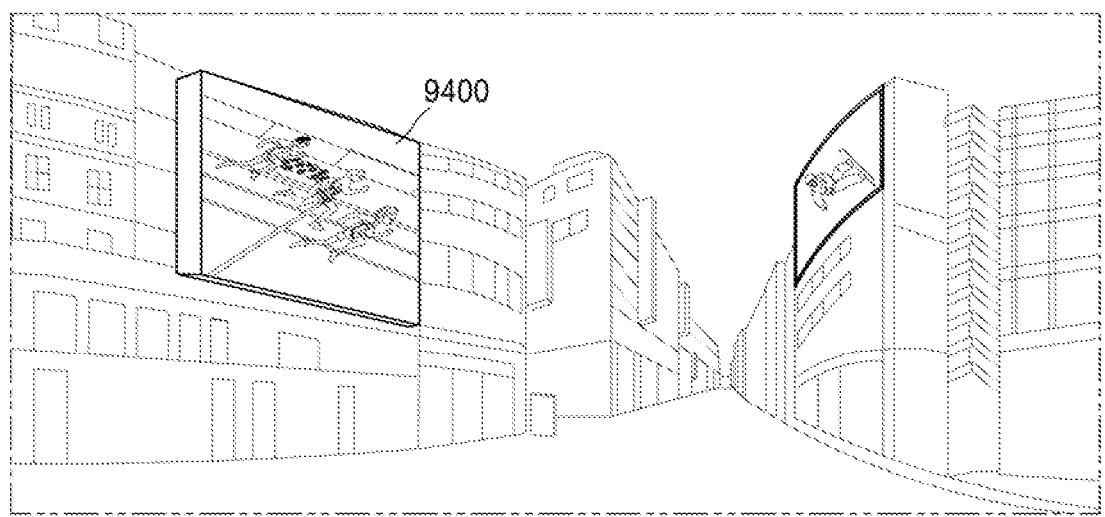
FIG. 25 illustrates an example in which a display apparatus according to embodiments is applied to a signage.

FIG. 25 illustrates an example in which the display apparatus according to embodiments is applied to a signage 9400. The signage 9400 may be used for outdoor advertisements using a digital information display and may control advertisement content and the like through a communication network. The signage 9400 may be implemented, for example, through the electronic device described above with reference to FIG. 21.

Figure 26:
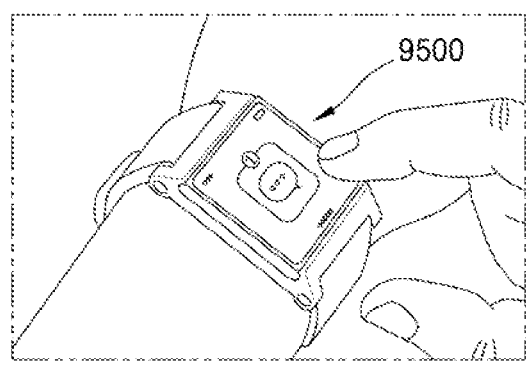
FIG. 26 illustrates an example in which a display apparatus according to embodiments is applied to a wearable display.

FIG. 26 illustrates an example in which the display apparatus according to embodiments is applied to a wearable display 9500. The wearable display 9500 may include the driving circuit, the light emitting device, the side reflective structure, the lower reflective structure, and the like described above and may be implemented through the electronic device described above with reference to FIG. 21.

The display apparatus according to an example embodiment may be applied to various products such as a rollable TV, a stretchable display, etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A device transfer substrate for receiving a light emitting device, the device transfer substrate comprising:
a plurality of recesses,
wherein each of the plurality of recesses comprises:
a first region having a shape of a first figure;
a second region having a shape of a second figure; and
an overlapping region on which a portion of the first region partially overlaps a portion of the second region, and
wherein a maximum width of the overlapping region in a direction intersecting with a straight line passing through a center of the first figure and a center of the second figure is less than a diameter or a diagonal length of the first figure and less than a diameter or a diagonal length of the second figure,
wherein the diameters or the diagonal lengths of the first figure and the second figure are greater than a diameter or a diagonal length of the light emitting device, and
wherein a first difference between the diameter or the diagonal length of the first figure and the diameter or the diagonal length of the light emitting device and a second difference between the diameter or the diagonal length of the second figure and the diameter or the diagonal length of the light emitting device are less than or equal to 20% of the diameter or the diagonal length of the light emitting device,
and wherein in each of the plurality of recesses, only one of the first region and the second region receives a light emitting device due to the first difference and the second difference.

2. The device transfer substrate of claim 1, wherein an area of the overlapping region is greater than 0 and less than or equal to ½ of an area of the first figure.

3. The device transfer substrate of claim 1, wherein a distance between the center of the first figure and the center of the second figure is greater than or equal to ½ of the diameter or the diagonal length of the first figure, and is less than a sum of ½ of the diameter or the diagonal length of the first figure and ½ of the diameter or the diagonal length of the second figure.

4. The device transfer substrate of claim 1, wherein a distance between the center of the first figure and the center of the second figure is greater than or equal to ⅔ of the diameter or the diagonal length of the first figure and is less than a sum of ½ of the diameter or the diagonal length of the first figure and ½ of the diameter or the diagonal length of the second figure.

5. The device transfer substrate of claim 1, wherein a difference between the diameter or the diagonal length of the first figure and the diameter or the diagonal length of the second figure is less than or equal to about 20% of the diameter or the diagonal length of the first figure.

6. The device transfer substrate of claim 1, wherein the first figure and the second figure have a circular or polygonal shape.

7. The device transfer substrate of claim 1, wherein both the first figure and the second figure have a quadrangular shape, and
wherein the first region and the second region are disposed such that a periphery of a vertex of the first figure overlaps a periphery of a vertex of the second figure or such that the periphery of the vertex of the first figure overlaps a periphery of one side of the second figure.

8. The device transfer substrate of claim 1, wherein both the first figure and the second figure have a trapezoidal shape, and
wherein the first region and the second region are disposed such that a periphery of a vertex of a shorter side of the first figure overlaps a periphery of a vertex of a shorter side of the second figure or such that a periphery of a vertex of a longer side of the first figure overlaps a periphery of a vertex of a longer side of the second figure.

9. The device transfer substrate of claim 1,
wherein each of the plurality of recesses further comprises a third region having a shape of a third figure, and
wherein the third region is disposed to partially overlap the second region and is further disposed not to overlap the first region.

10. The device transfer substrate of claim 1, further comprising a barrier surrounding a boundary of each of the plurality of recesses.

11. The device transfer substrate of claim 10, wherein the first region, the second region, and the overlapping region of one recess are surrounded by the barrier so that the first region and the second region are connected to each other based on the overlapping region in the one recess.

12. The device transfer substrate of claim 1, wherein the first figure is symmetrical and the center of the first figure is a line of symmetry of the first figure, and the second figure is symmetrical, and the center of the second figure is a line of symmetry of the second figure.

13. A device transfer structure comprising:
a device transfer substrate comprising a plurality of recesses; and
only one light emitting device disposed in each of the plurality of recesses,
wherein each of the plurality of recesses comprises:
a first region having a shape of a first figure;
a second region having a shape of a second figure; and
an overlapping region on which a portion of the first region partially overlaps a portion of the second region,
wherein the one light emitting device disposed in each of the plurality of recesses is disposed only one of the first region and the second region,
wherein a maximum width of the overlapping region in a direction intersecting with a straight line passing through a center of the first figure and a center of the second figure is less than a diameter or a diagonal length of the first figure and less than a diameter or a diagonal length of the second figure so that the light emitting device disposed in each of the plurality of recesses does not pass through the overlapping region,
wherein the diameters or the diagonal lengths of the first figure and the second figure are greater than a diameter or a diagonal length of the light emitting device, and
wherein a difference between the diameter or the diagonal length of the first figure and the diameter or the diagonal length of the light emitting device and a difference between the diameter or the diagonal length of the second figure and the diameter or the diagonal length of the light emitting device are less than or equal to 20% of the diameter or the diagonal length of the light emitting device.

14. The device transfer structure of claim 13, wherein an area of the overlapping region is greater than 0 and less than or equal to ½ of an area of the first figure.

15. The device transfer structure of claim 13, wherein a distance between the center of the first figure and the center of the second figure is greater than or equal to ½ of the diameter or the diagonal length of the first figure, and is less than a sum of ½ of the diameter or the diagonal length of the first figure and ½ of the diameter or the diagonal length of the second figure.

16. The device transfer structure of claim 13, wherein a distance between the center of the first figure and the center of the second figure is greater than or equal to ⅔ of the diameter or the diagonal length of the first figure and is less than a sum of ½ of the diameter or the diagonal length of the first figure and ½ of the diameter or the diagonal length of the second figure.

17. The device transfer structure of claim 13, wherein a difference between the diameter or the diagonal length of the first figure and the diameter or the diagonal length of the second figure is less than or equal to about 20% of the diameter or the diagonal length of the first figure.

18. The device transfer structure of claim 13, wherein a difference between the diameter or the diagonal length of the first figure and a diameter or a diagonal length of the light emitting device is less than or equal to 5 μm.

19. The device transfer structure of claim 13, wherein an area of the overlapping region is less than an area of the light emitting device.

20. The device transfer structure of claim 13, wherein a size of the light emitting device is in a range of 5 μm to 100 μm.

21. The device transfer structure of claim 13,
wherein each of the plurality of recesses of the device transfer substrate further comprises a third region having a shape of a third figure,
wherein the third region is disposed to partially overlap the second region and not to overlap the first region, and
wherein the light emitting device is disposed only within the second region or within at least one of the first region and the third region.

22. The device transfer structure of claim 13, wherein each of the plurality of recesses further comprises:
a first electrode pair comprising a first driving electrode and a second driving electrode disposed in the first region; and
a second electrode pair comprising a third driving electrode and a fourth driving electrode disposed in the second region, and
wherein the light emitting device is electrically connected to any one of the first electrode pair and the second electrode pair.

23. The device transfer structure of claim 13, wherein the device transfer substrate further comprises a barrier surrounding a boundary of each of the plurality of recesses.

24. The device transfer structure of claim 23, wherein the first region, the second region, and the overlapping region of one recess are surrounded by the barrier so that the first region and the second region are connected based on the overlapping region in the one recess.

25. A device transfer substrate for receiving a light emitting device, the device transfer substrate comprising:
a plurality of recesses, each of the plurality of recesses comprising a first end having a first width, a second end having a second width, and a middle portion between the first end and the second end, the middle portion having a middle width,
wherein the middle width is less than the first width and the middle width is less than the second width,
wherein the first width and the second width are greater than a diameter or a diagonal length of the light emitting device,
wherein a first difference between the first width and the diameter or the diagonal length of the light emitting device and a second difference between the second width and the diameter or the diagonal length of the light emitting device are less than or equal to 20% of the diameter or the diagonal length of the light emitting device,
and wherein in each of the plurality of recesses, only one of the first end and the second end receives a light emitting device due to the first difference and the second difference.

26. The device transfer substrate of claim 25, wherein the first end has a shape of a first figure and the second end has a shape of a second figure, and
wherein the first figure and the second figure partially overlap to form the middle portion.

\* \* \* \* \*